US011469663B2

(12) United States Patent
Shlomo

(10) Patent No.: US 11,469,663 B2
(45) Date of Patent: Oct. 11, 2022

(54) DUAL REGULATION-LOOP RAMP-CONTROLLED DC-DC CONVERTER

(71) Applicant: Infineon Technologies LLC, San Jose, CA (US)

(72) Inventor: Oren Shlomo, Haifa (IL)

(73) Assignee: Infineon Technologies LLC, San Jose, CA (US)

(*) Notice: Subject to any disclaimer, the term of this patent is extended or adjusted under 35 U.S.C. 154(b) by 0 days.

(21) Appl. No.: 17/032,642

(22) Filed: Sep. 25, 2020

(65) Prior Publication Data

US 2021/0281171 A1    Sep. 9, 2021

Related U.S. Application Data

(60) Provisional application No. 62/986,046, filed on Mar. 6, 2020.

(51) Int. Cl.
    *H02M 3/07*     (2006.01)
    *G11C 16/30*    (2006.01)

(52) U.S. Cl.
    CPC ............... *H02M 3/07* (2013.01); *G11C 16/30* (2013.01); *H02M 3/071* (2021.05)

(58) Field of Classification Search
    None
    See application file for complete search history.

(56) References Cited

U.S. PATENT DOCUMENTS

| | | | |
|---|---|---|---|
| 2009/0237960 A1 | 9/2009 | Coulson et al. | |
| 2009/0322303 A1* | 12/2009 | Hirata | H02M 3/156 323/284 |
| 2011/0025283 A1 | 2/2011 | Futamura | |
| 2012/0306465 A1 | 12/2012 | Suga et al. | |
| 2016/0294283 A1 | 10/2016 | Nedovic | |
| 2017/0213510 A1* | 7/2017 | Takenaka | H02M 3/156 |
| 2018/0375435 A1* | 12/2018 | Muhoberac | H02M 3/158 |
| 2019/0214973 A1 | 7/2019 | Choi et al. | |
| 2019/0250046 A1 | 8/2019 | Sun et al. | |
| 2020/0164764 A1 | 5/2020 | Son et al. | |
| 2021/0099082 A1* | 4/2021 | Romeo | H02M 3/156 |
| 2021/0119533 A1* | 4/2021 | Liang | H02M 1/14 |
| 2021/0211047 A1* | 7/2021 | Zhao | H02M 1/0041 |

OTHER PUBLICATIONS

International Search Report and Written Opinion of the International Searching Authority for International Application No. PCT US2021/021189, dated May 21, 2021; 19 pages.

* cited by examiner

*Primary Examiner* — Tan T. Nguyen

(57) ABSTRACT

A DC-DC converter including voltage and slope regulation and a method of operating the same are provided. Generally, the converter includes a voltage source to supply an output, a switching-circuit coupled to the voltage sources to control a voltage on the output, and a slope-detector coupled to the switching-circuit and the output to detect a slope of a voltage transition between a first and a second voltage. When the detected slope exceeds a predetermined maximum the slope-detector sends a digital signal to the switching-circuit to intermittently pause the voltage transition to limit the slope to less than the maximum. In one embodiment, the voltage source is a charge-pump, and the switching-circuit includes a logic-gate coupled to the slope-detector to turn the charge-pump ON when the detected slope is less than the maximum, and to turn OFF the charge-pump for a time when the slope exceeds the maximum.

20 Claims, 28 Drawing Sheets

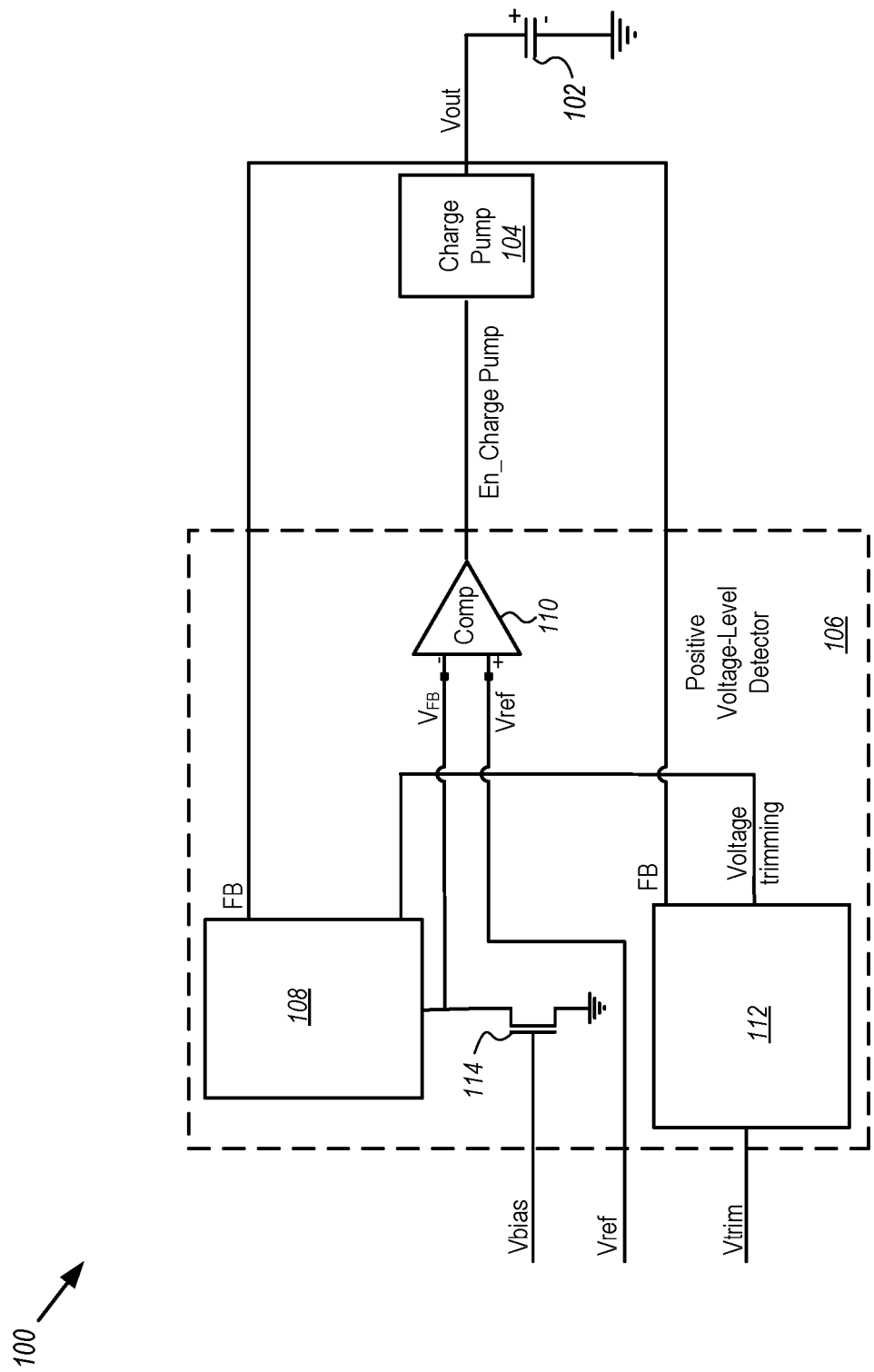
FIG. 1
(Conventional)

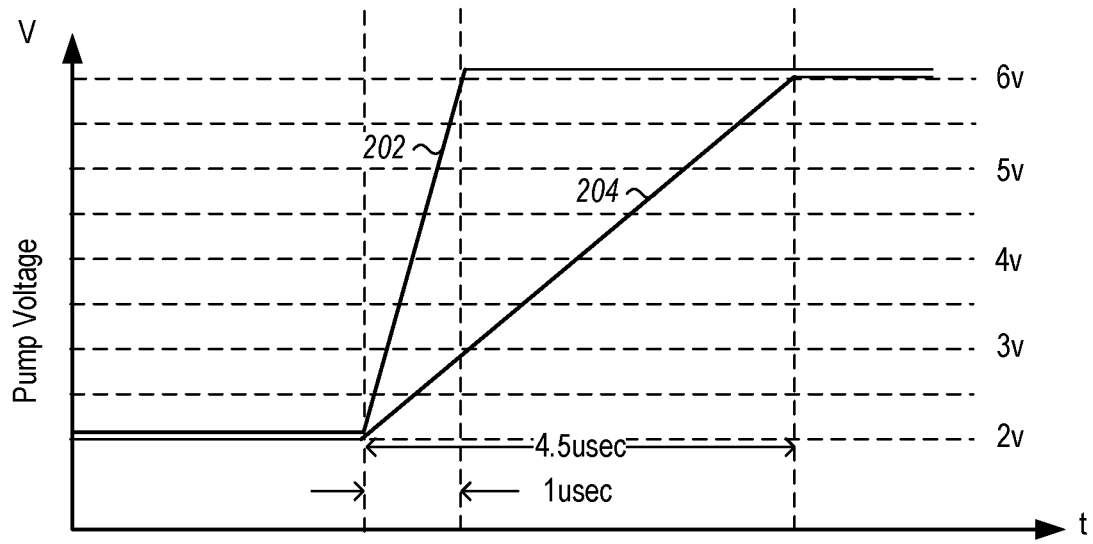
FIG. 2A
*(Conventional)*
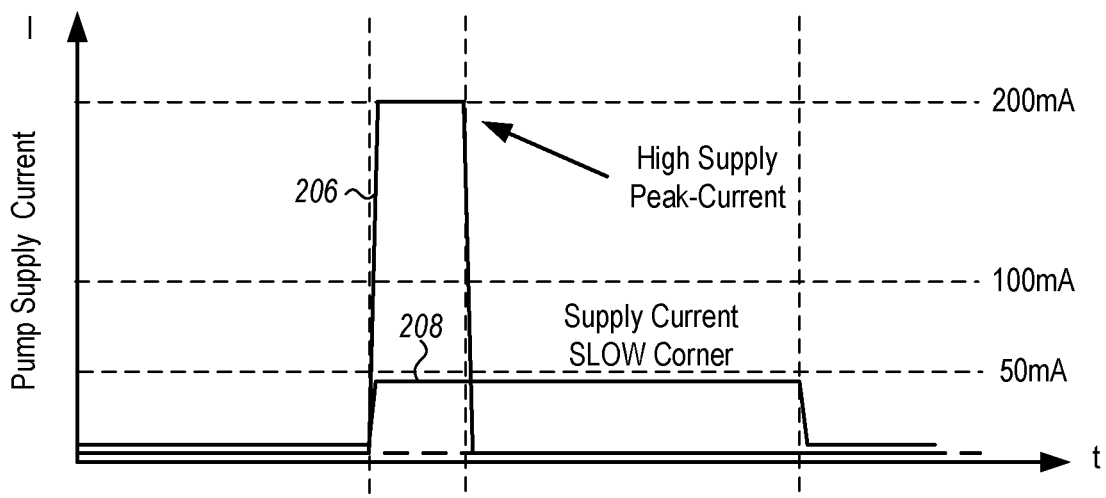
FIG. 2B
*(Conventional)*

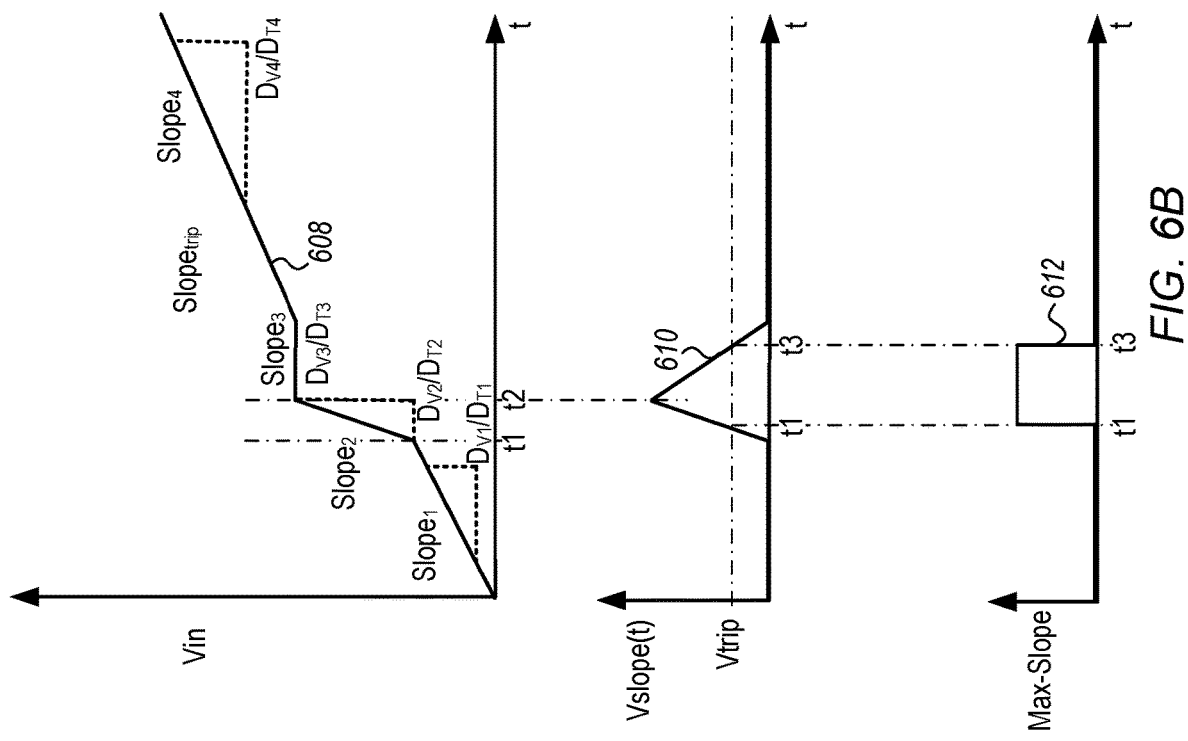
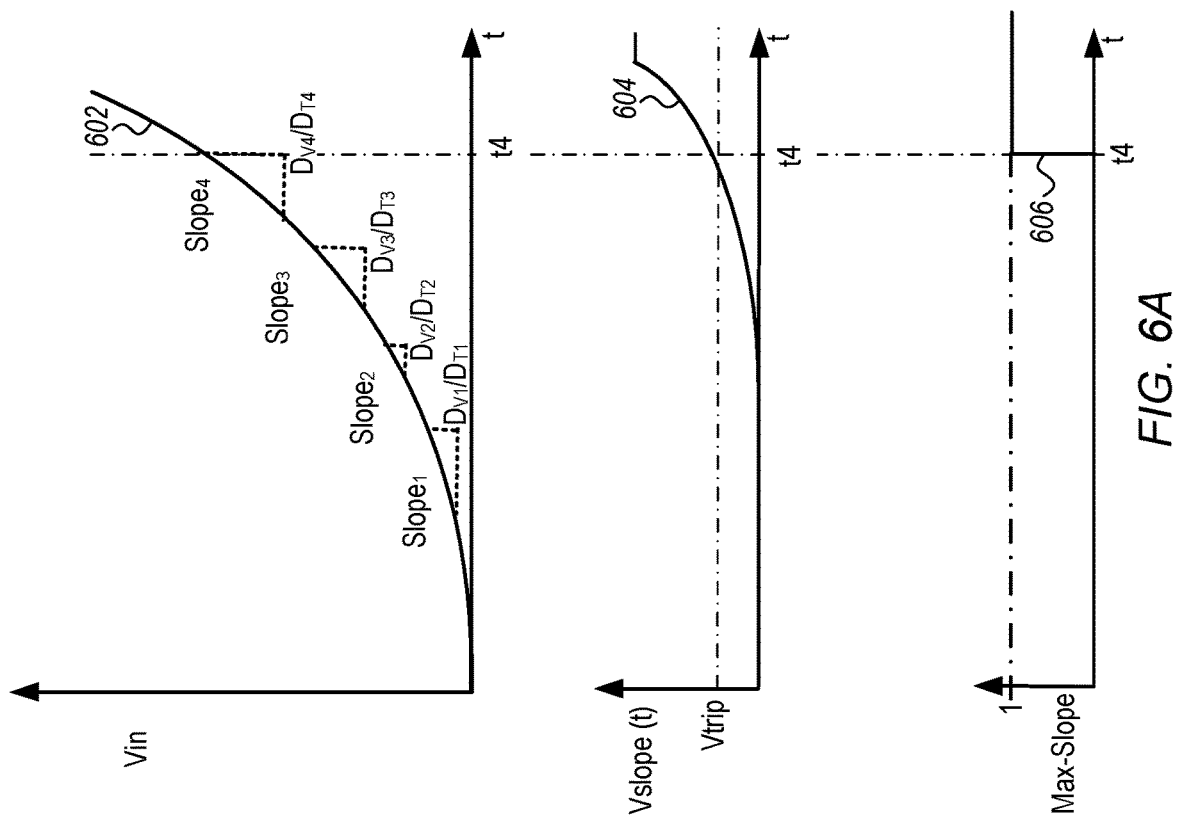
FIG. 6A
FIG. 6B

DUAL REGULATION-LOOP RAMP-CONTROLLED DC-DC CONVERTER

CROSS-REFERENCE TO RELATED APPLICATIONS

This application claims the benefit of priority under 35 U.S.C. 119(e) to U.S. Provisional Patent Application Ser. No. 62/986,046, filed Mar. 6, 2020, which is incorporated by reference herein in its entirety.

TECHNICAL FIELD

This disclosure relates generally slope-detector and control circuits, and more particularly to DC-DC converters, regulators and switches including such circuits and methods of operating the same to limit a slope of transitioning analog signals or voltages.

BACKGROUND

Direct-current to Direct-current (DC-DC) converters, regulators and switches are used in a wide range of applications to couple a transitioning analog signal or voltage to device. For example, DC-DC converters are frequently used as voltage supplies in semiconductor or flash memories, to provide a number of different voltages at different times to a possibly changing load.

FIG. 1 is a block diagram of one such DC-DC converter 100 used to provide voltages to program and erase a memory device (represented here by a consumer or capacitive load 102). Generally, the DC-DC converter 100 includes a charge-pump 104, and a voltage-level-detector 106 to detect an output voltage (Vout) from the charge-pump, and to regulate the output voltage (Vout) by turning the charge-pump ON and OFF using a digital signal or pulse.

In the embodiment shown, the voltage-level-detector 106 is an A→D positive voltage-level-detector and includes a divider network 108, a comparator 110 and a voltage trimming circuit 112. In operation the DC-DC converter 100 receives a reference voltage (Vref), a bias voltage (Vbias) and a feedback signal (FB) from the output of the charge-pump. Vref represents a desired or target output voltage from the DC-DC converter 100 and is coupled to positive input of the comparator 110. Vbias activates a switch 114 through which the divider network 108 is coupled to ground to apply a feedback voltage (VFB) to a negative input of the comparator 110. The divider network 108, which can include a resistor or capacitor divider network, converts or shifts the voltage of the FB signal to the feedback voltage (VFB) relative to the charge-pump 104 output voltage, and the comparator 110 compares this VFB with Vref. It is noted that in this voltage-regulation scheme the comparator 110 digitally controls the operation of the charge-pump 104 based on the analog data of its inputs, VFB and Vref, respectively. When the charge-pump 104 output voltage (Vout) is lower than the target voltage (Vref), the VFB input of the comparator 110 is lower than Vref and the comparator enables the charge-pump 104 to ramp-up to the desired or target output voltage. Additionally, the voltage trimming circuit 112 receives a voltage trim signal (Vtrim) and feedback from the output of the charge-pump 104, and in response thereto to controls the divider network 108 to adjust or trim the charge-pump output voltage.

FIGS. 2A and 2B are wave diagrams illustrating, respectively, output voltage from and supply current to the conventional DC-DC converter of FIG. 1 at slowest and fastest conditions. Since the DC-DC converters and the circuits in which they used are typically designed to ensure DC-DC converters or voltage sources functioning at the worst case or slowest operating conditions meet a minimum design specification, other voltage sources in the same DC-DC converter, or in a different converter integrally formed therewith, are likely capable of functioning at faster conditions to perform significantly faster voltage transitions.

Referring to FIG. 2A, for a system or memory including a number of positive DC-DC converters, such as that shown in FIG. 1, and operating to increase an output voltage to a memory devices from 2V to 6V, a first, strong DC-DC converter having a fast pump out corner (represented by line 202) completes the transition in about 1 microsecond (μsec), while a second, weak DC-DC converter, fabricated on the same integrated circuit (IC) using the same processes requires about 4.5 μsec to make the same 4V transition, and thus has a slowest pump out corner (represented by line 204). While both results can be within tolerances specified by a designer, this difference in transition times can cause forward-bias and high-voltage signals race violations where both voltage sources are configured and connected to drive separate memory devices in the same semiconductor memory. Furthermore, referring to FIG. 2B, the voltage sources having the fastest pump out corner can consume a significantly higher supply peak current (represented by line 206) as compared to the current drawn by the voltage source having the slowest pump out corner (represented by line 208) which is undesirable.

Accordingly, there is a need for a circuit and method to limit or eliminate differences in transition times (slope) of voltage transitions between different voltage sources in a single DC-DC converter or in separate converters configured and connected to drive separate devices in the same circuit. It is further desirable that circuit and method limits a supply peak-current. Finally, there is a need for a circuit architecture that enables a designer to set important performance parameters of the DC-DC converter regardless of variations in process corners.

SUMMARY

A system including slope detection and/o regulation and methods of operating the same are provided. The system and methods are particularly useful in or with an embedded non-volatile memory (eNVM) or flash macro calling for one or more voltages to enable different modes of operation. Generally, the system includes a voltage source to supply voltages an output, a switching-circuit coupled to the voltage sources to control a voltage on the output, and a slope-detector coupled to the switching-circuit and the output to detect a slope of a voltage transition between a first and a second voltage. When the detected slope exceeds a predetermined maximum the slope-detector sends a signal to the switching-circuit to intermittently pause the voltage transition for a time to limit the slope to less than the predetermined maximum.

In one embodiment, the system is a direct current-to-direct current (DC-DC), the voltage source is a charge-pump, and the switching-circuit includes a logic-gate coupled to the slope-detector to turn the charge-pump ON when the detected slope is less than the predetermined maximum, and to intermittently turn the charge-pump OFF when the detected slope exceeds the predetermined maximum.

In another embodiment, the system is a multiplexing DC-DC converter, and the switching-circuit includes a multiplexer including one or more switches coupled between the number of voltage sources and the output. The multiplexer is configured to turn ON one of the switches to couple one of the number of voltage sources to the output when the detected slope of the voltage transition is less than or equal to a maximum slope, and to turn OFF the switch when the detected slope exceeds the predetermined maximum slope.

Generally, the method begins with providing a first voltage on an output of the DC-DC converter connected to a capacitive load. A second voltage is then coupled from a one of a number of voltage sources to the output using a switching-circuit in the DC-DC converter, and a slope of a voltage transition on the output between the first voltage and the second voltage is detected. Next, a signal is generated and coupled to the switching-circuit when the detected slope of the voltage transition exceeds a predetermined maximum slope, and the voltage transition is intermittently interrupting using the switching-circuit to limit the slope of the voltage transition to less than or equal to the predetermined maximum slope.

BRIEF DESCRIPTION OF DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIG. 1 (conventional) is a schematic block diagram of a conventional direct current-to-direct current (DC-DC) converter;

FIGS. 2A and 2B (conventional) are wave diagrams illustrating output voltage from and supply current to the DC-DC converter of FIG. 1 at slowest and fastest conditions;

FIG. 6A illustrates wave diagrams of input voltage to and signals from the positive slope-detector of FIG. 5 where a rate of change (slope) of the input voltage increases monotonically, and where the slope-detector is used in an open-loop configuration as a slope-detector and not in a slope-regulation-loop;

FIG. 6B illustrates wave diagrams of input voltage to and from the positive slope-detector of FIG. 5, where the input voltage includes an spike in a slope of the input voltage, and where the slope-detector is used in an open-loop as a slope-detector and not in a slope-regulation-loop;

DETAILED DESCRIPTION

A direct current-to-direct current (DC-DC) converter including slope regulation and methods of operating the same are provided. The DC-DC converter and methods of operating the same are particularly useful in or with a system including an embedded non-volatile memory (eNVM) or flash macro calling for one or more voltages to enable different modes of operation.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein may include both to directly electrically connect two or more components or elements and to indirectly connect through one or more intervening components.

Figure 3:
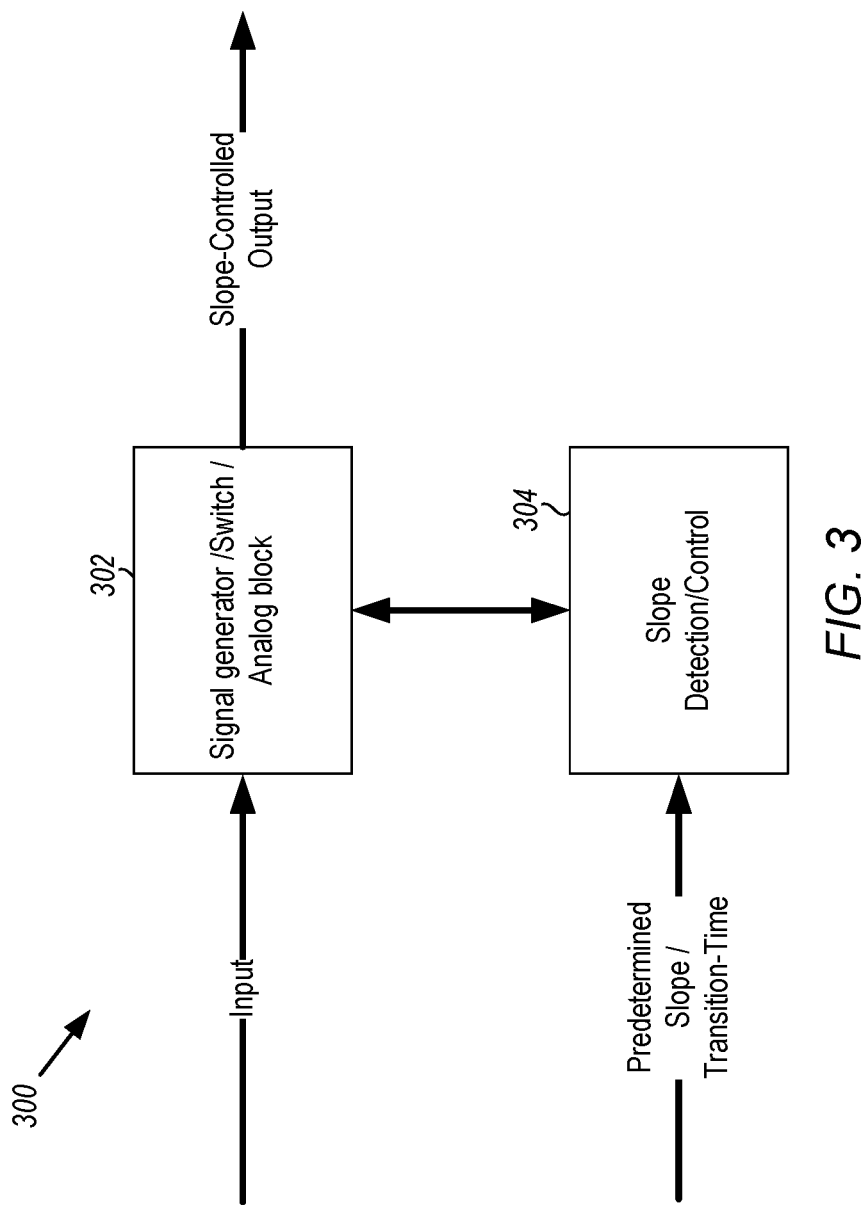
FIG. 3 is a block diagram of a system including a device for coupling an input voltage from an input to an output of the system, and a slope detection and control circuit.

FIG. 3 is a block diagram of a system 300 including a device 302 and a slope detection and control circuit 304 for coupling an input signal or voltage to a slope-controlled output of the system. The device 302 can include, but is not limited to, any device capable of receiving generating an analog output voltage or signal, with or without receiving an analog input, and requiring a slope-controlled output, including analog multiplexers, analog de-multiplexes, analog switches, analog regulators or converters, and signal generators. Generally, the slope detection and control circuit 304 limits the slope or rate of transition of the output to less than a predetermined slope or transition-time. In particular, the slope detection and control circuit 304 allows for conversion of analog slope to digital data, conversion of analog slope to time (in the form of pulse width) thereby enabling controlling a slope of signals in both analog and digital systems. A similar system with minor modifications can be also used for limiting the minimum slope, making sure all output slopes are higher than a predetermined slope.

Figure 4:
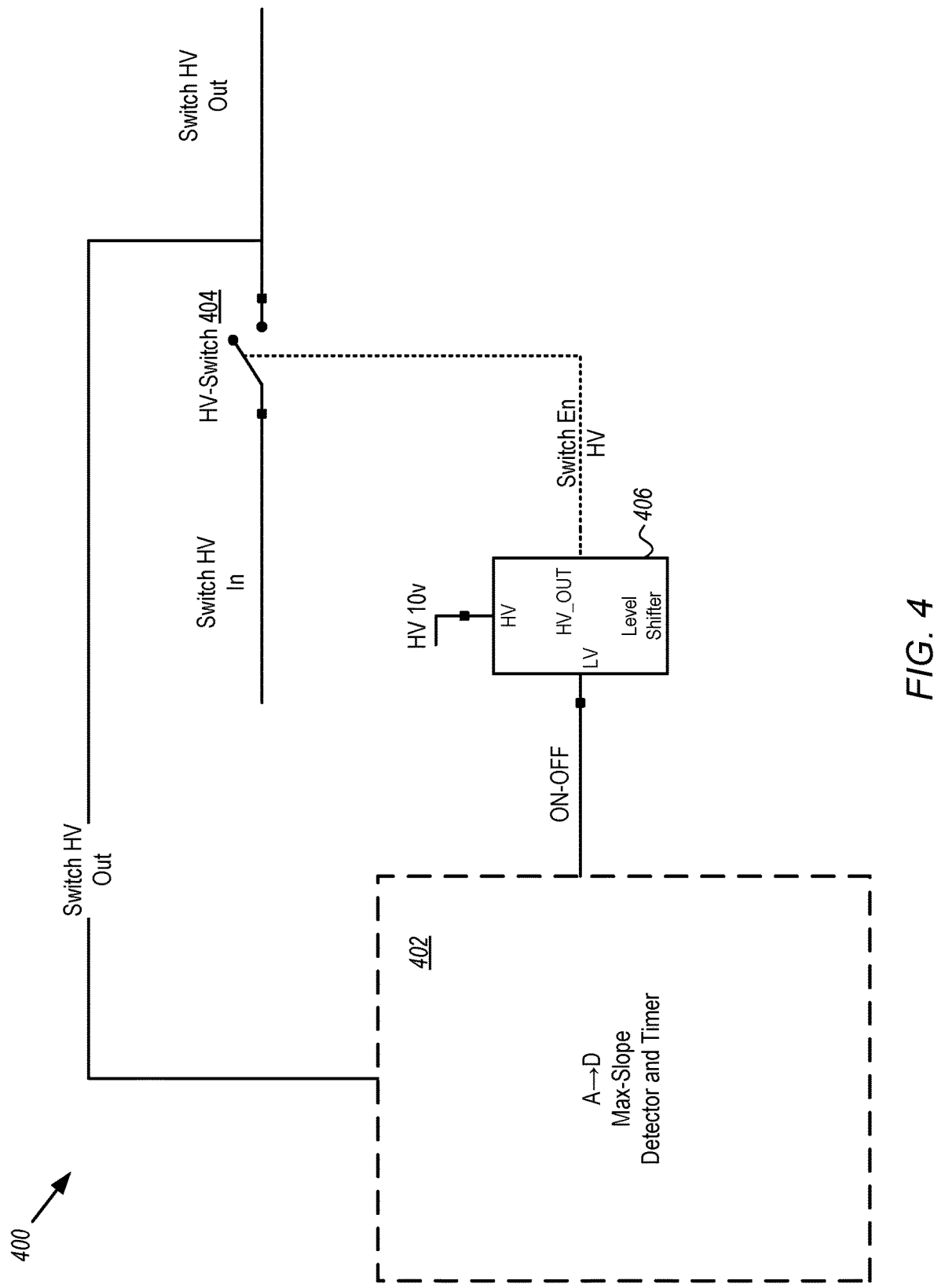
FIG. 4 is a schematic block diagram of an embodiment of a slope-limiting switch including a maximum slope-detector, level shifter and high voltage (HV) switch.

FIG. 4 is a schematic block diagram of an embodiment of a slope-limiting switch or switching-circuit 400 including an analog-to-digital (A→D) maximum slope-detector and timer 402, and illustrating an implementation in which the switching-circuit can include any type of general-purpose switch 404 capable of being digitally controlled, and which is connected to the slope-detector and timer to form an ON-OFF slope-regulation-loop. In the embodiment shown the switch 404 is a high voltage (HV) switch, and the switching-circuit 400 further includes an optional level shifter 406 that enables low voltage (LV), digital ON-OFF to control the HV switch to couple a HV applied to an input of the switch (Switch HV In) to an output (Switch HV Out) while limiting the slope or rate of transition of the voltage on the output to a slope-regulated output. The slope-detector and timer 402 includes analog elements or circuits and logic elements that enable the slope-detector and timer to determine if a slope of the Switch HV Out (Output$_{SLOPE}$) of a voltage transition between a first voltage on the output and a second voltage is less than an ideal or maximum slope (Slope$_{MAX}$). If the slope of the voltage transition is less than the maximum slope (Output$_{SLOPE}$<Slope$_{MAX}$) an ON signal is output to close the switch 404. If however the slope of the voltage transition is greater than the maximum slope (Output$_{SLOPE}$>Slope$_{MAX}$) an OFF signal is output to open the switch 404 interrupting the voltage transition for a slope-dependent delay or wait time, after which the switch is again turned ON or closed. Generally, the slope-detector and timer 402 includes a current source and integration capacitor coupled on one terminal to an input of the detector, and on the other terminal to the slope controlled output, and a comparator to determine if the slope of the voltage transition has exceeded the predetermined maximum slope. The delay or wait time is set by the time needed for the integration capacitor to discharge to the comparator trip point following interruption of the voltage transition. Briefly, the slope-detector and timer 402 compares the output (Switch HV Out) to a continuing ramping signal (which is built across the capacitor ports) produced in the slope-detector and timer substantially with the same slope as the predetermined maximum slope (Slope$_{MAX}$) and the switching-circuit 400 will close or turn ON when the continuous ramping signal crosses the paused output voltage. If the output voltage, when enabled, again exceeds the Slope$_{MAX}$, the switch 404 will open or turn OFF, and the output voltage will again stop ramping up after a comparator element delay time.

Figure 5:
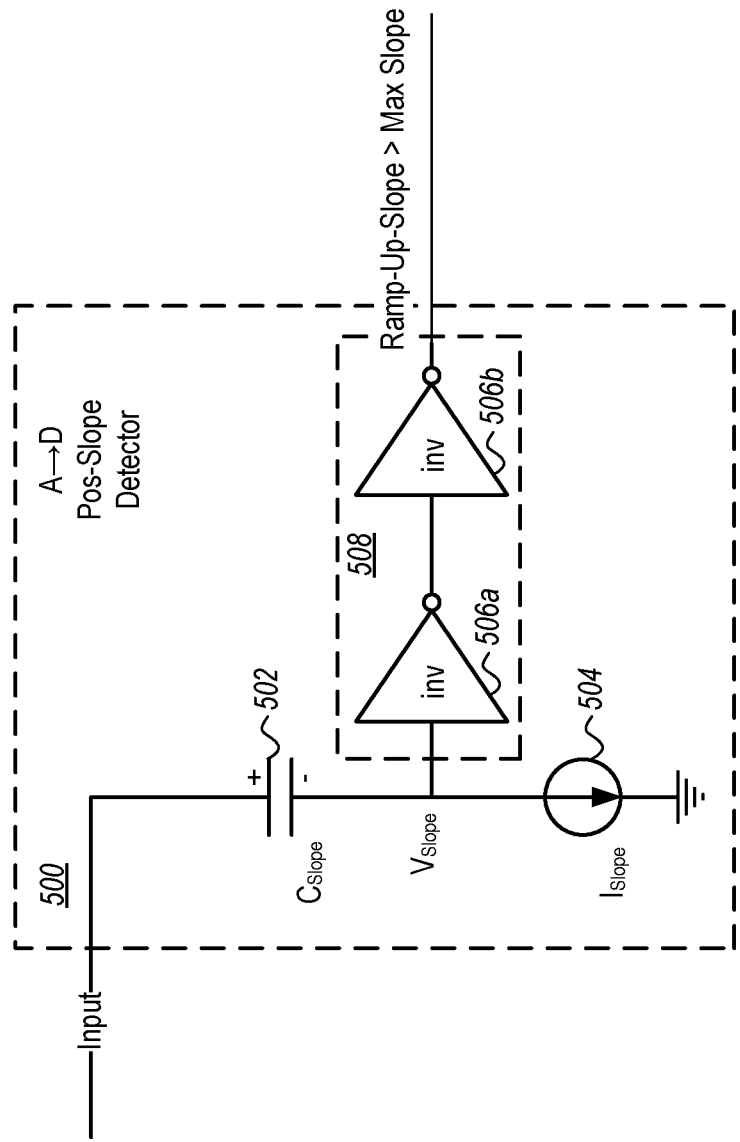
FIG. 5 is a schematic block diagram of an embodiment of a positive slope-detector for detection and subsequent regulation or limiting of ramp-up signals.

FIG. 5 is a schematic block diagram of an embodiment of an A→D ramp-up or positive slope-detector 500 suitable for use in the slope-limiting switching-circuit of FIG. 4. Referring to FIG. 5, the positive slope-detector 500 includes a feedback or integration capacitor (Cslope 502) having a first terminal coupled through an input to the detector to the output of the slope-limiting switching-circuit, a current source (Islope 504) coupled between a second terminal of the capacitor and ground, and two serial inverters 506a and 506b as a comparator 508. The first inversion stage or inverter is used as a comparator and it can be followed by any number of inverters to match to a desired target block control signal load capacitance and polarity.

A transition direction and transition speed for voltage ($V_{SLOPE}$) on an input node to the comparator 508 depends on a difference between an output slope (Output$_{SLOPE}$) from an output of a circuit (not shown in this figure) in which the slope-detector 500 is included, and an ideal or maximum slope (Slope$_{MAX}$). A rate at which $V_{SLOPE}$ changes, i.e., a slope of a transition of $V_{SLOPE}$, is a derivative of $V_{SLOPE}$ and correlates to a difference between the output slope and the maximum slope (Output$_{SLOPE}$−Slope$_{MAX}$). In a maximum slope-detector, such as shown in FIG. 5, $V_{SLOPE}$ transitions up if the Output$_{SLOPE}$ is higher than Slope$_{MAX}$ and transitions down if Output$_{SLOPE}$ is lower than Slope$_{MAX}$. The magnitude or voltage of $V_{SLOPE}$ goes up or down according to this difference and a derivative of $V_{SLOPE}$ depends on the magnitude of this difference. Thus, the magnitude of $V_{SLOPE}$ is not in itself used for slope detection or regulation. Rather it is the voltage transition direction, or the derivative of $V_{SLOPE}$, that enables slope detection or regulation. When $V_{SLOPE}$ goes up and down around a trip-point voltage ($V_{TRIP}$) of the comparator, it indicates that the Output$_{SLOPE}$ is higher and then lower than Slope$_{MAX}$ respectively, and a local averaged slope of the output is substantially equal to Slope$_{MAX}$.

Accordingly, it will be understood that the accuracy of $V_{TRIP}$ of the comparator is not critical when used in slope-regulation-loop, since slope regulation begins when $V_{SLOPE}$ first crosses $V_{TRIP}$, and then due to the nature of ON/OFF regulation toggles or oscillates around $V_{TRIP}$. On wakeup of the max slope-detector it is desirable that $V_{SLOPE}$ is at or slightly higher than $V_{TRIP}$ to prevent an unregulated "free running" output transition in which Output$_{SLOPE}$>Slope$_{MAX}$, which can occur if $V_{SLOPE} \ll V_{TRIP}$.

In the embodiment of the positive slope-detector 500 the predetermined maximum slope (Slope$_{MAX}$) is proportional to $I_{SLOPE}/C_{SLOPE}$, and, because the integration capacitor 502 and current source 504 are integrally formed on a single integrated circuit (IC) chip, is constant over process, voltage and temperature (PVT) conditions.

The time for which the voltage transition is interrupted ($T_{SLOPE-WAIT}$) is an integration time needed for the magnitude of the slope indication voltage ($V_{SLOPE}$) to drop to less than the magnitude of the slope-detector's trip-point voltage ($V_{TRIP}$) and is equal to:

$$T_{SLOPE-WAIT}=[C_{SLOPE} \times |VSLOPE-VTRIP|/I_{SLOPE}]$$

FIG. 6A illustrates wave diagrams of input voltage to and signals from the positive slope-detector of FIG. 5 where a rate of change (slope) of the input voltage increases monotonically, and where the slope-detector is not used in a slope-regulation-loop, but rather operated in open-loop mode as a maximum slope-detector. Referring to the top wave diagram of FIG. 6A it is noted that a voltage into the positive slope-detector ($V_{IN}$ 602) has a slope of the voltage transition of Slope$_1$ ($D_{v1}/D_{t1}$) at a first time, a Slope$_2$ ($D_{v2}/D_{t2}$) at a second time, Slope$_3$ ($D_{v3}/D_{t3}$) at a third time, and a Slope$_4$ ($D_{v4}/D_{t4}$) at a fourth time. Referring to the middle wave diagram of FIG. 6A it is noted that the voltage of $V_{SLOPE}$ ($V_{SLOPE}$ (t) 604) is less than $V_{TRIP}$. However at time t4 Slope$_4$>Slope$_{MAX}$, the voltage of $V_{SLOPE}$ ($V_{SLOPE}$ (t) 604) exceeds $V_{TRIP}$ and the positive slope-detector 500 outputs a maximum slope detected signal (Max-Slope 606) as shown in the lower plot of FIG. 6A. Since 6A relates to an open-loop slope-detector, which does not limit a slope of a signal or voltage, but rather only indicates if the slope exceeds Slope$_{MAX}$, thus the Max-Slope 606 output will remain high or a "1" as long as the slope of $V_{IN}$ is higher than Slope$_{MAX}$.

FIG. 6B illustrates wave diagrams of input voltage to and from the positive slope-detector of FIG. 5, where the input voltage includes an spike in a slope of the input voltage, and where the slope-detector is used in an open-loop as a slope-detector and not in a slope-regulation-loop. Referring to the top wave diagram of FIG. 6B it is noted that $V_{IN}$ 608 into the positive slope-detector 500 has an initial slope, Slope$_1$ ($D_{v1}/D_{t1}$), and thus the voltage of $V_{SLOPE}$ ($V_{SLOPE}$ (t) 610) is less than $V_{TRIP}$ as indicated in the middle wave diagram of FIG. 6B. However, at time t1 the slope of the voltage transition increases to a slope, Slope$_2$ ($D_{v2}/D_{t2}$), $V_{SLOPE}$ (t) 610 exceeds $V_{TRIP}$ causing the positive slope-detector 500 to output a max-slope detected or OFF signal (Max-Slope 612) as shown in the lower plot of FIG. 6B.

FIG. 6B also shows in the bottom wave diagram a signal or indication (Max-Slope) that indicates when the slope of input voltage ($V_{IN}$) momentarily or briefly goes higher than the slope trip-point ($V_{TRIP}$), and then goes lower. Generally, the positive slope-detector 500 will indicate this event by a pulse. The pulse width of the Max-Slope 612 will account for the time ($T_{SLOPE-WAIT}$) needed for $V_{SLOPE}$ (t) 610 to fall back below $V_{TRIP}$. Referring to the middle wave diagram, it is also noted that during the time in which $V_{SLOPE}$ (t) 610 is greater than $V_{TRIP}$, i.e., t1 to t3, signal $V_{SLOPE}$ (t) 610 can be limited to a maximum voltage equal to the voltage of a voltage supply ($V_{DD}$) to the slope-detector, or to a predetermined maximum between $V_{TRIP}$ and $V_{DD}$. The pulse width in the above illustrated case depends on the $V_{SLOPE}-V_{TRIP}$ voltage difference ($DV_{TRIP}$) divided by a reference slope ($I_{SLOPE}/C_{SLOPE}$) of the positive slope-detector. The width of the pulse which is generally the delay or wait time required for the positive slope-detector 500 to reset and once again assert an ON signal, is derived from the timer property of the slope-detector-and-timer and is equal to:

$$(V_{SLOPE}-V_{TRIP})/(I_{SLOPE}/C_{SLOPE})$$

Thus, the positive slope-detector 500 converts a difference slope into a delay after the input signal stops or finishes its transition. That is, once the positive slope-detector's input voltage ($V_{IN}$) ceases to ramp-up after crossing $V_{TRIP}$, the magnitude of the slope indication voltage ($V_{SLOPE}$) is above the comparator's 508 trip-point ($V_{TRIP}$) and $V_{SLOPE}$ starts to integrate down with a slope equal to $I_{SLOPE}/C_{SLOPE}$. The delay or wait time until $V_{SLOPE}$ crosses back over $V_{TRIP}$ is generally equal to the delay or wait time required for the positive slope-detector 500 to reset and once again assert an ON signal as shown in the lower wave diagram of FIG. 6B. As noted previously herein, the ON signal causes the switch 404 in the switching-circuit 400 to close, resuming the voltage transition resulting in a slope, Slope$_4$ ($D_{v4}/D_{t4}$). The time or duration of the delay or wait time ($T_{SLOPE-WAIT}$) prior to resuming the voltage transition is an integration time needed for a magnitude of the slope indication voltage ($V_{SLOPE}$) to drop to less than the trip point voltage ($V_{TRIP}$) of the comparator 508. It is further noted that $V_{TRIP}$ is a parameter of the inverter 506a (and in second order, of inverter 506b) of the comparator 508, and is not related to the maximum slope (Slope$_{MAX}$). Furthermore, $V_{TRIP}$ absolute voltage accuracy is not critical for determining $T_{SLOPE-WAIT}$, or for the slope regulation accuracy, since operating the slope-detector in a closed-loop slope regulation mode will self-align $V_{SLOPE}$ below or above $V_{TRIP}$ during an ON or OFF operation respectively, and thus $V_{SLOPE}$ common-mode follows $V_{TRIP}$, allowing $DV_{TRIP}$ ($V_{SLOPE}-V_{TRIP}$) to not depend on $V_{TRIP}$ although the wait time ($T_{SLOPE-WAIT}$) which is equal to:

$$T_{SLOPE-WAIT}=[C_{SLOPE} \times (|V_{SLOPE}-V_{TRIP}|/I_{SLOPE}]$$

Figure 7:
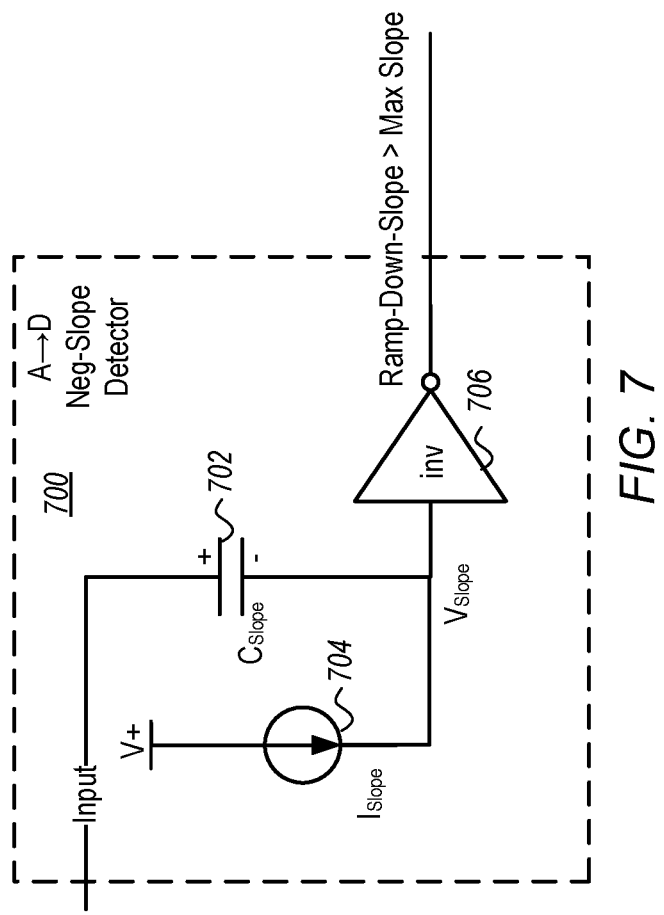
FIG. 7 is a schematic block diagram of an embodiment of a negative slope-detector for detection and subsequent regulation or limiting of ramp-down signals.

FIG. 7 is a schematic block diagram of an embodiment of an A→D ramp-down or negative slope-detector 700 suitable for use in the system of FIG. 4. Referring to FIG. 7 the negative slope-detector 700 includes a feedback or integration capacitor 702 having a first terminal coupled, through an input of the slope-detector to an output of a circuit in which it is included (such as the slope-limiting switching-circuit 400 shown in FIG. 4). The negative slope-detector 700 further includes, a current source 704 coupled between a second terminal of the capacitor 702 and a positive voltage supply or source, and a single inverter 706 to serve as a comparator (which can be followed by any number of inversion stages or inverters as required). Input slope is detected by integrating a current on the capacitor 702 that is coupled to the input. When an absolute value of a negative slope of an input voltage is less than a predetermined maximum slope (Slope$_{MAX}$), the slope indication voltage (V$_{SLOPE}$) on the second terminal of the capacitor 702 is greater than a trip point voltage (V$_{TRIP}$) of the comparator (inverter 706) and the negative slope-detector 700 outputs a "0" or signal that enables/closes the HV switch 404 (in FIG. 4), resuming the voltage transition on the output of the switching-circuit 400. If however the absolute value of the negative slope of the input voltage is greater than Slope$_{MAX}$, the slope indication voltage (V$_{SLOPE}$) is less than V$_{TRIP}$ and the negative slope-detector 700 outputs a "−1" or signal that disables/opens the HV switch 404 (in FIG. 4), interrupting the voltage transition on the output of the switching-circuit 400. As with the positive slope-detector 500 described above the target slope trip point of the negative slope-detector 700 is equal to:

$$Slope_{MAX} = I_{SLOPE}/C_{SLOPE}.$$

The time for which the voltage transition is interrupted (T$_{SLOPE-WAIT}$) is an integration time needed for the slope indication voltage (V$_{SLOPE}$) to increase to more than the trip point voltage (V$_{TRIP}$) of the inverter 706, which is only a parameter of the inverter and not related to the maximum slope (Slope$_{MAX}$) at all. Thus, V$_{TRIP}$ absolute voltage accuracy is not critical for determining T$_{SLOPE-WAIT}$, or for the slope regulation accuracy, since operating the slope-detector in a closed-loop slope regulation mode will self-align V$_{SLOPE}$ below or above V$_{TRIP}$ during an ON or OFF operation respectively, and thus V$_{SLOPE}$ common-mode follows V$_{TRIP}$, allowing DV$_{TRIP}$ (V$_{SLOPE}$−V$_{TRIP}$) to not depend on V$_{TRIP}$ although the wait time (T$_{SLOPE-WAIT}$) which is equal to:

$$T_{SLOPE-WAIT} = [C_{SLOPE} \times |V_{SLOPE} - V_{TRIP}|/I_{SLOPE}], \text{ contains } V_{TRIP}.$$

Figure 8:
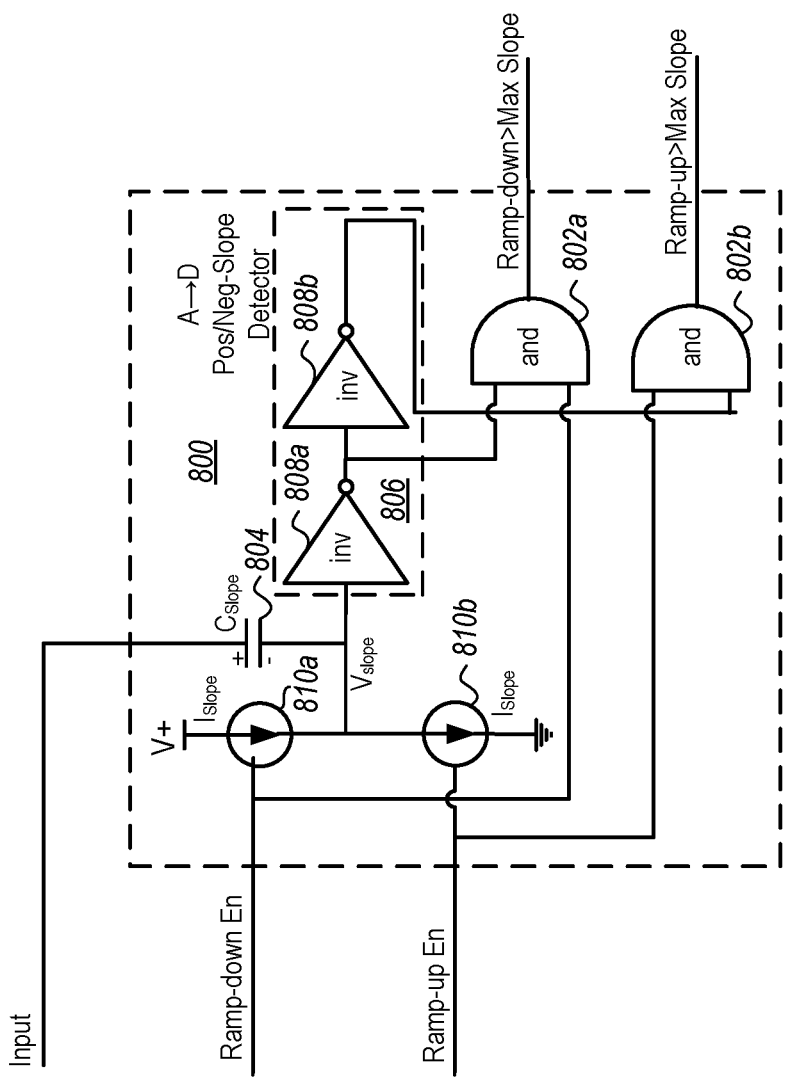
FIG. 8 is a schematic block diagram of an embodiment of a user-selected combined positive and negative maximum slope-detector combined positive and negative maximum slope-detector for detection and subsequent regulation or limiting of ramp-up and ramp-down signals.

FIG. 8 is a schematic block diagram of an embodiment of a user-selected or controlled combined positive and negative (Pos/Neg) maximum slope-detector 800 suitable for use in the system of FIG. 4. This Pos/Neg maximum slope-detector 800 is a combination of the positive and negative slope-detectors described previously in FIGS. 5 and 7 with the addition of logic gates or elements 802a and 802b, and requires a user to select a transition direction of the input signal, either positive or negative. Referring to FIG. 8 the user-selected Pos/Neg maximum slope-detector 800 is bi-directional and generally includes in addition to the logic gates 802a, 802b, an integration capacitor 804 having a first terminal coupled to an input of the detector, a comparator 806 including first and second serially connected inverters 808a, 808b, and first and second current sources 810a, 810b, serially connected between a positive voltage source and ground.

In operation, when the user selects a voltage transition having a ramp-down or negative slope, a ramp-down enable signal (Ramp-down En) is applied to activate or enable the first current source 810a and to apply a logic "1" to a first input terminal of first logic gate 802a. Because first logic gate 802a is an AND gate the circuit functions like the negative slope-detector 700 of FIG. 7, where if the voltage of V$_{SLOPE}$ is less than V$_{TRIP}$ the first inverter 808a of the comparator 806 outputs another logic "1" to a second input terminal of first logic gate 802a causing a Ramp-down>Max Slope signal to be sent to the HV switch 404 in switching-circuit 400, interrupting the voltage transition on the output of the switching-circuit.

Similarly when the user selects a voltage transition having a ramp-up or positive slope, a ramp-up enable signal (Ramp-up En) is applied to activate or enable the second current source 810b and to apply a logic "1" to a first input terminal of second logic gate 802b. Because second logic gate 802b is an AND gate the circuit functions like the positive slope-detector 500 of FIG. 5, where if the voltage of V$_{SLOPE}$ greater than V$_{TRIP}$ the second inverter 808b of the comparator 806 outputs another logic "1" to a second input terminal of second logic gate 802b causing a Ramp-up>Max Slope signal to be sent to the HV switch 404 in switching-circuit 400, interrupting the voltage transition on the output of the switching-circuit.

Additionally, it is noted that the maximum slope to which the output voltage transition is regulated or controlled need not be of the same magnitude for ramp-up and ramp-down transitions. This can be accomplished, for example, by varying currents from the first and second current source 810a, 810b.

Figure 9:
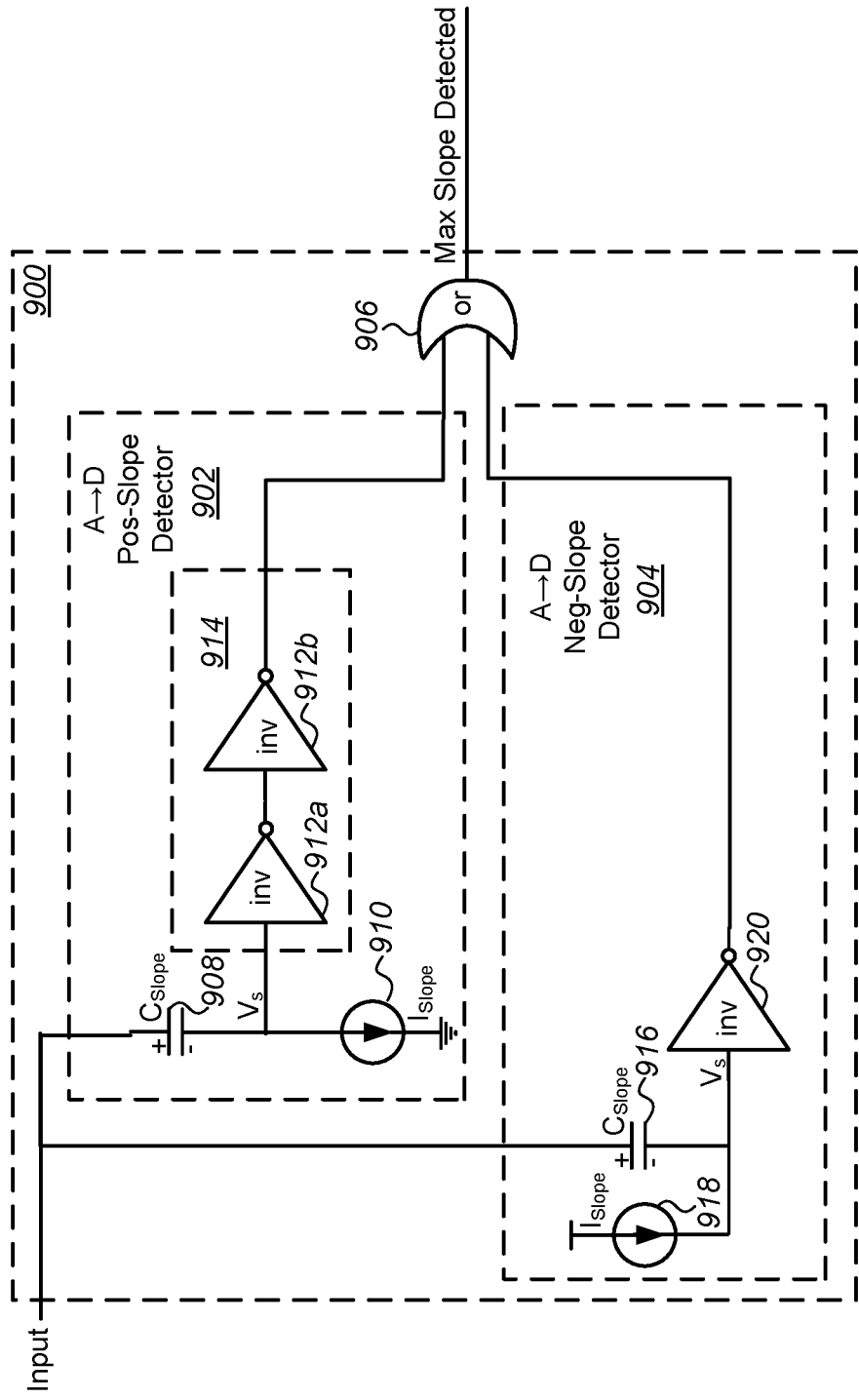
FIG. 9 is a schematic block diagram of another embodiment of a combined positive and negative maximum slope-detector for seamless, automatic detection and subsequent regulation or limiting of ramp-up and ramp-down signals suitable for use in the system of FIG. 4.

FIG. 9 is a schematic block diagram of another embodiment of a slope-detector 900 including separate positive and negative slope-detectors suitable for use in the system of FIG. 4, and which does not require a user to select a transition direction of the input slope or signal. Referring to FIG. 9 the slope-detector 900 includes a positive slope-detector 902 and a negative slope-detector 904, the output of each serve as one input to a logic gate 906, such as an OR gate, configured so that should the positive or negative detector detect a slope on the input exceeding a predetermined maximum slope the logic gate outputs a maximum slope detected signal causing the HV switch 404 in switching-circuit 400 to open, interrupting the voltage transition on the output of the switching-circuit.

The positive slope-detector 902 is substantially identical to and functions similarly to the positive slope-detector 500 of FIG. 5. In the embodiment shown, the positive slope-detector 902 includes a first feedback or integration capacitor 908 having a first terminal coupled through an input of the slope-detector 900 to the output of the slope-limiting switching-circuit 400, a current source 910 coupled between a second terminal of the first capacitor 908 and ground, and two serial inverters 912a and 912b as a comparator 914.

The negative slope-detector 904 is substantially identical to and functions similarly to the negative slope-detector 700 of FIG. 7. In the embodiment shown, the negative slope-detector 904 includes a second feedback or integration capacitor 916 having a first terminal coupled through an input of the slope-detector 900 to the output of the slope-limiting switching-circuit 400, a second current source 918 coupled between a second terminal of the second capacitor 916 and a positive voltage source, and a single, third inverter 920, which functions as a comparator.

Again, it is noted that the slope to which the output voltage transition is regulated or controlled need not be of the same magnitude for ramp-up and ramp-down transitions. This can be accomplished, for example, by varying the capacitance of the first and second integration capacitors 908, 916, and/or by varying currents from the first and second current sources 910, 918.

Figure 10:
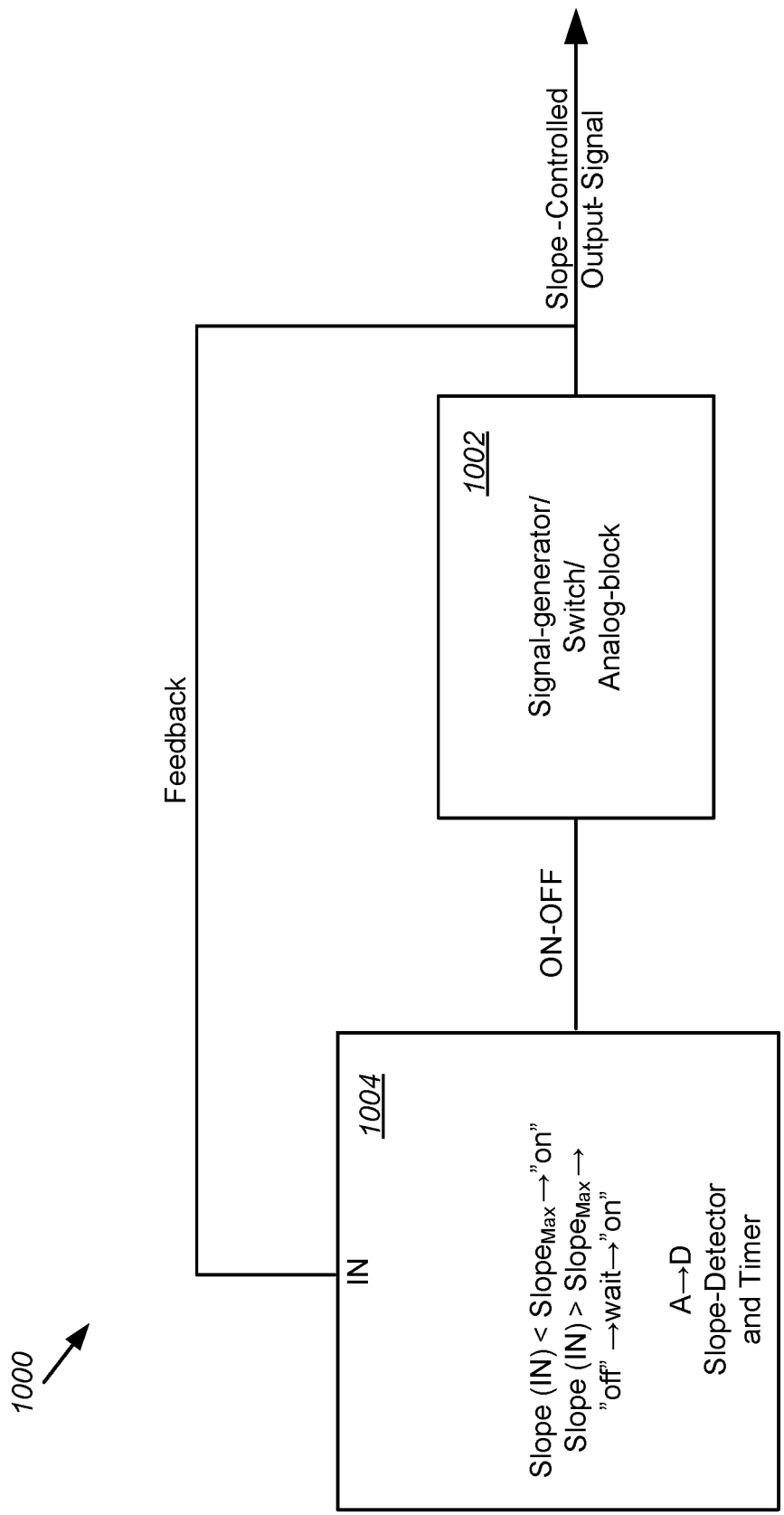
FIG. 10 is a block diagram of a system including a device and a slope detection and control circuit for controlling the device to produce a slope-controlled output signal from the system.

FIG. 10 is a block diagram of a system 1000 including a device 1002 and a slope detection and control circuit 1004 for controlling the device to produce a slope-controlled output signal from the system. FIG. 10 illustrates a general digital slope-regulation-loop which is supported by the slope detection and control circuit 1004. The device 1002 can include any device capable of being operated by a digital, on-off input, signal and providing an analog signal in response thereto for which a slope-controlled output-signal is desired. Suitable devices 1002 can include analog multiplexers, analog de-multiplexes, analog switches, analog regulators or converters, and signal generators. Generally, the slope detection and control circuit 1004 limits the slope or rate of transition of the output to less than a predetermined slope or transition-time. In particular, the slope detection and control circuit 1004 allows for controlling the slope of an analog signal by dynamically controlling a frequency and duration of on-off pulses used to enable or operate the device 1002. As noted, circuit 1004 does this dynamically and adapts a duration and frequency or spacing between ON pulses according to the strength of the signal or voltage from the device 1002 at any given point in time, which means that the spacing can significantly change during a voltage transition, and thus is referred as dynamic. Generally the slope detection and control circuit 1004 can include any of the positive, negative or combined positive/negative slope-detectors described previously herein with reference to FIG. 5, 7, 8 or 9.

Finally, as with the combined positive/negative slope-detectors of FIGS. 8 and 9, where the slope detection and control circuit 1004 includes a combined positive/negative slope-detector it is noted that the slope to which the output voltage transition is regulated or controlled need not be of the same magnitude for ramp-up and ramp-down transitions. This can be accomplished, for example, by varying the capacitance of the first and second integration capacitors where present, and/or by varying currents from the first and second current source. Moreover, the slope regulation value of ramp-up/ramp-down can dynamically change during the output signal's transition by similarly changing the $I_{SLOPE}$ during the transition, or even changing the value of $C_{SLOPE}$.

Figure 11A:
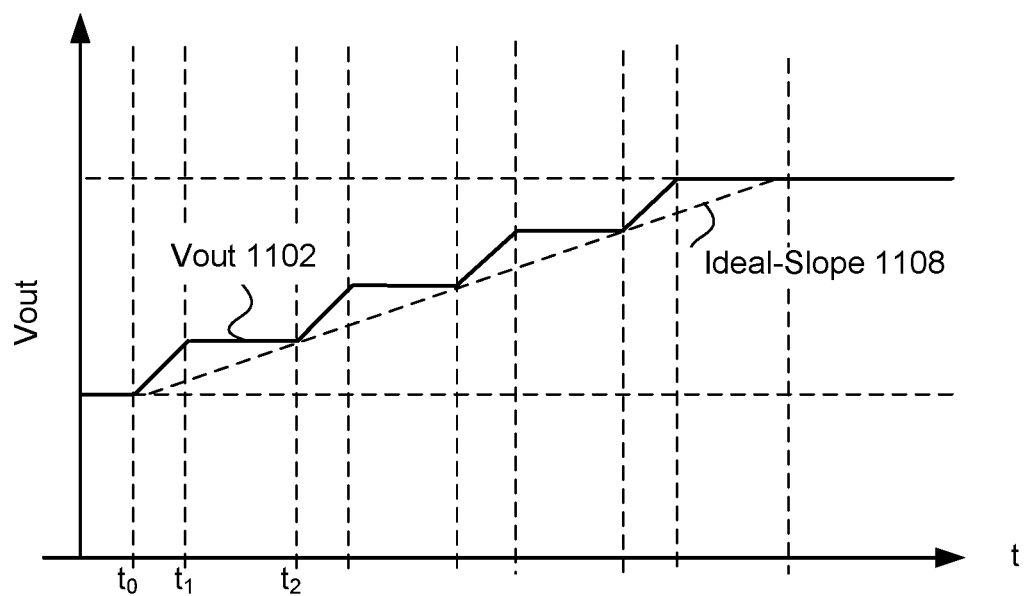
FIG. 11A is a wave diagram of a slope regulated output and input to the slope detection and control circuit of the system of FIG. 10.
Figure 11B:
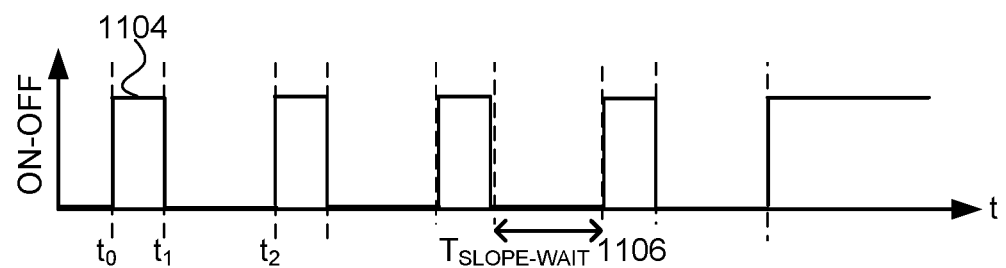
FIG. 11B is a wave diagram of an on/off signal generated by the slope detection and control circuit of FIG. 10 and used to control the device.

FIGS. 11A and 11B are wave diagrams of a slope-controlled output-signal (Vout 1102 in FIG. 11A) from the system 1000 of FIG. 10 and control signals (ON-OFF 1104 in FIG. 11B) from the slope detection and control circuit 1004 to the device 1002. Referring to FIGS. 11A and 11B beginning at time t0 an ON signal or pulse is sent from the slope detection and control circuit 1004 to the device 1002 resulting in a ramp-up of the slope-controlled output signal (Vout 1102). At time t1 the slope detection and control circuit 1004 detects a slope of Vout 1102 exceeds a predetermined maximum slope and withdraws the ON signal (or asserts an OFF signal), interrupting the ramp-up of Vout for a predetermined wait time until time t2. As noted previously herein, the slope detection and control circuit 1004 includes a current source and integration capacitor coupled to an input of the detector, and a comparator to determine if the slope of the voltage transition has exceeded the predetermined maximum slope, the time for which the voltage transition is interrupted ($T_{SLOPE-WAIT}$ 1106 in FIG. 11B) is equal to:

$$T_{SLOPE-WAIT}=[C_{SLOPE}\times|V_{SLOPE}-V_{TRIP}|/I_{SLOPE}]$$

Figure 12:
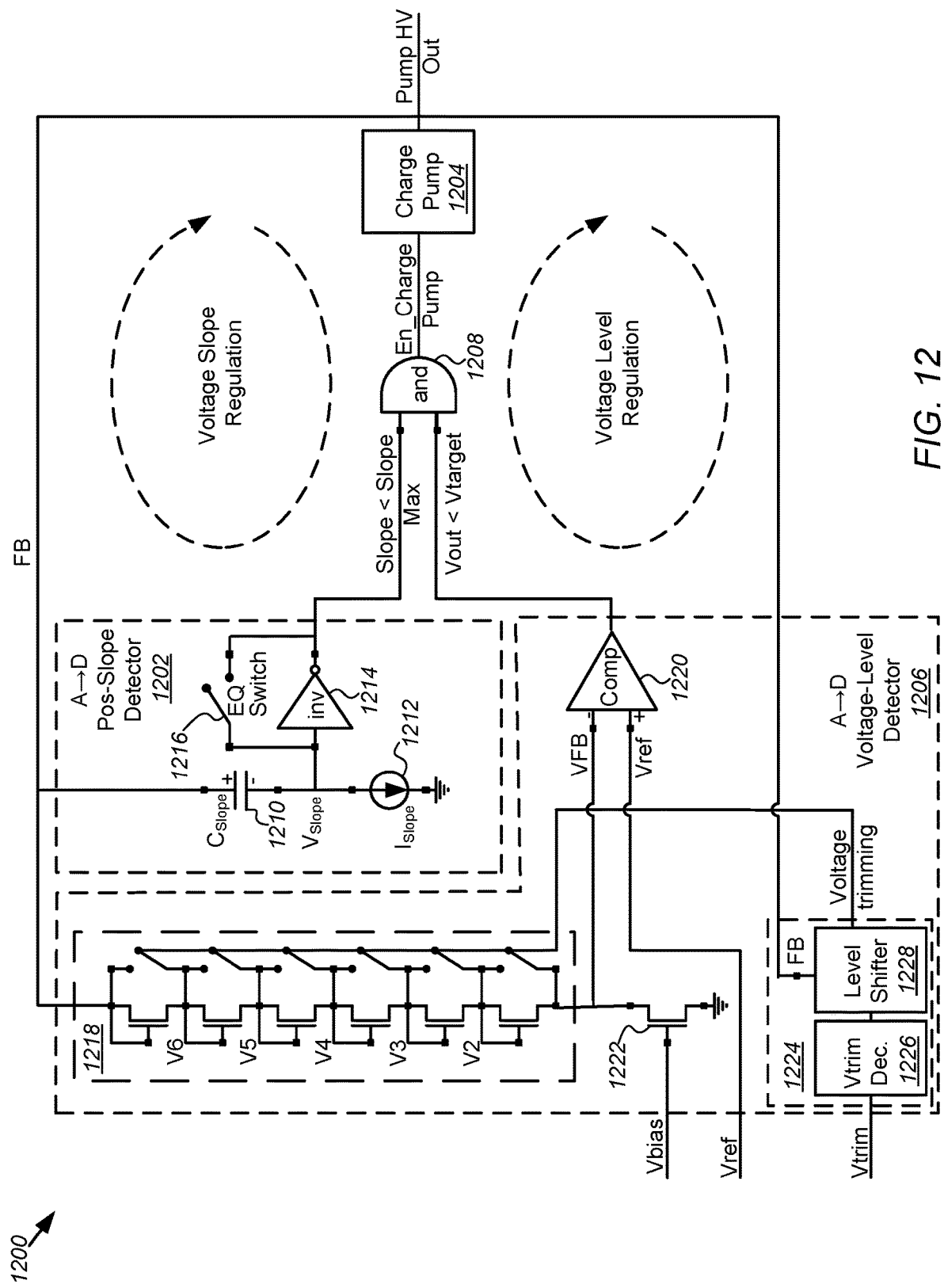
FIG. 12 is a schematic block diagram of a DC-DC converter including a charge-pump and both a voltage-level-detector and a positive slope-detector to simultaneously regulate a voltage level and/or slope.

This wait time allows the slope-controlled output signal (Vout 1102) to cross an ideal-slope line (Ideal-Slope 1108 in FIG. 11B) before the transition is resumed. The Ideal-Slope 1108 is equal to Ideal-Slope=$[|I_{SLOPE}/C_{SLOPE}]$ can be regulated by increasing or decreasing $I_{SLOPE}$ or $C_{SLOPE}$-FIG. 12 is a schematic block diagram of a DC-DC converter 1200 for which a slope-detector 1202, such as one of those described previously herein, is particularly useful. The DC-DC converter 1200 in addition to the slope-detector 1202 includes a charge-pump 1204, voltage-level-detector 1206 and a logic gate 1208, such as the AND gate shown, to enable the slope-detector to regulate a slope of the pump HV output while the voltage-level-detector regulates the voltage of the pump HV output.

This logic gate 1208 combines outputs of two different regulation-loops, a voltage-level-regulation-loop and a voltage slope-regulation-loop, into a single logic signal that enables or disables operation of the charge-pump 1204. The AND function is used in this case since both regulation-loops allow the charge-pump 1204 to operate until a regulation parameter limit is crossed, either voltage-level or voltage-slope. The voltage-level regulation-loop stops the charge-pump 1204 output ramp-up when the output voltage exceeds a target voltage-level. Charge-pump 1204 operation resumes when output voltage crosses back below the target voltage-level—hence, an ON-OFF voltage-regulation. The voltage-slope regulation—stops the charge-pump 1204 output ramp-up when the output ramp-up voltage-slope exceeds a target ramp-up-slope. Charge-pump 1204 operation resumes after a slope-driven wait period—hence, an ON-OFF slope regulation.

The charge-pump 1204 can include any suitable charge-pump capable of providing a maximum desired output voltage and can be controlled by on/off operation using a digital signal or pulse. In the embodiment shown in which the DC-DC converter 1200 is a positive DC-DC converter the charge-pump 1204 is an unregulated, positive charge-pump. By unregulated it is meant that the charge-pump 1204 itself includes no internal regulator for either slope or voltage output, and therefore begins ramping-up (or down in the case of an unregulated, negative charge-pump) to the maximum voltage the charge-pump 1204 is capable of producing.

In the embodiment shown the slope-detector 1202 is an A→D positive slope-detector. However, it is noted that the slope-detector 1202 can alternatively include a negative slope-detector or a combination positive and negative slope-detector as described previously herein. Referring to FIG. 12, the slope-detector 1202 includes a feedback or integration capacitor 1210 having a first terminal coupled to the pump HV output of the DC-DC converter 1200 to form an voltage slope-regulation-loop, a current source 1212 coupled between a second terminal of the capacitor and ground, and a single inverter 1214, which functions as a comparator for the slope-detector. In addition in the embodiment shown the slope-detector further includes an equalization (EQ) switch 1216 coupled between an input and output of the inverter 1214. The EQ switch 1216, which can be controlled either manually by a user or automatically by an external system in which the DC-DC converter 1200 is used, enables the inverter 1214 to be reset to its trip-point, thereby enabling faster or near instantaneous operation of the slope-detector 1202 whether it is for wakeup purposes or to prepare the slope-detector for a new output transition after the slope regulated output has stopped ramping for a time (saturating the detector) and is about to start again, or for switching from positive to negative slope detection. As with the slope-detectors described previously herein the predetermined maximum slope ($SLOPE_{MAX}$) is proportional to $I_{SLOPE}/C_{SLOPE}$, and, because the integration capacitor and current source are integrally formed on a single IC chip, is constant over substantially all PVT conditions. The time for which the voltage transition is interrupted ($T_{SLOPE-WAIT}$) is an integration time needed for a magnitude of $V_{SLOPE}$ to drop to less than $V_{TRIP}$ and is equal to:

$$T_{SLOPE-WAIT}=[C_{SLOPE}\times|V_{SLOPE}-V_{TRIP}|/I_{SLOPE}]$$

The voltage-level-detector 1206 is an A→D positive voltage-level-detector and in the embodiment shown includes a diode-stack 1218, a comparator 1220, a reference voltage (Vref), and a bias voltage (Vbias). Vref represents or is related to a shifted or desired target output voltage from the DC-DC converter 1200. Vbias is coupled to a gate of an n-channel transistor 1222 with same Width/Length as the n-channel devices in the diode-stack 1218, which forms a constant current source which the diode-stack is coupled to, for adjusting a feedback (FB) voltage (VFB). The diode-stack 1218 shifts the charge-pump output voltage (Pump HV Out) to the feedback voltage (VFB) relative to the charge-pump 1204 output voltage, and the comparator 1220 compares this VFB with Vref. It is noted that in this voltage-regulation scheme the comparator 1220 digitally controls the operation of the charge-pump 1204 based on the analog data of its inputs, FB and Vref, respectively. Thus, when the charge-pump 1204 output voltage (Pump HV Out) is lower than the target voltage, the feedback voltage (VFB) applied to the VFB input of the comparator 1220 is lower than the target or reference voltage (Vref) and the comparator enables the charge-pump to ramp-up to the desired or target output voltage. The final output voltage (Pump HV Out) is limited to the target voltage by the voltage-level-detector 1206 through the voltage-level-regulation-loop.

Additionally in some embodiments, such as that shown, the voltage-level-detector 1206 further includes a voltage trimming circuit 1224 to receive a digital voltage trim signal (Vtrim) which requires high-voltage level from the output of the charge-pump 1204 to allow its internal Level-Shifters to control the number of active n-channel devices in the diode-stack which operate in high-voltage, by controlling the switches in the diode-stack 1218 to adjust or trim the pump HV Out. Generally, the voltage trimming circuit 1224 includes a voltage trim decoder 1226 and several level shifters 1228. The voltage trim decoder 1226 changes a digital or binary Vtrim low-voltage signal (LV) to a high-voltage (HV) charge pump level signal. The level shifters 1228 receives the LV digital signal from the voltage trim decoder 1226 as well as a HV signal from the output of the charge-pump 1204, and combines and shifts a level of these signals to yield a voltage trimming signal used to control switches in the diode-stack 1218. The switches require charge pump level voltage for their operation.

An advantage of the ramp-controlled DC-DC converter 1200 of FIG. 12 include that it enables slope-limited output voltage transitions that are corner independent and are equal to $I_{SLOPE}/C_{SLOPE}$. This in turn limits peak charge-pump supply current, and prevents undesirable bias conditions, which can result when one of multiple converters in the same chip (or IC) has too fast of a ramp-up or ramp-down transition. Furthermore, because the transition time is corner independent the ramp-controlled DC-DC converter 1200 enables a designer to design for the fastest transition possible which the system can tolerate, while preventing faster transitions in fast corners or lower load conditions. This allows preventing analog races without the need to consider operating conditions, corners and capacitive output load.

Figure 13A:
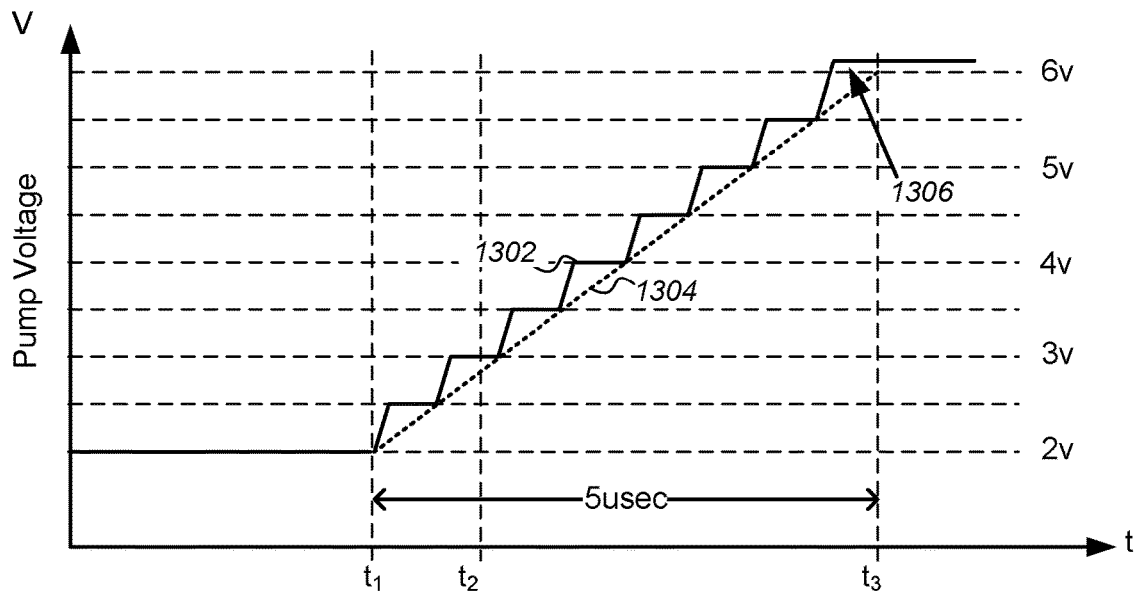
FIG. 13A is a wave diagram illustrating an output voltage the DC-DC converter of FIG. 12.
Figure 13B:
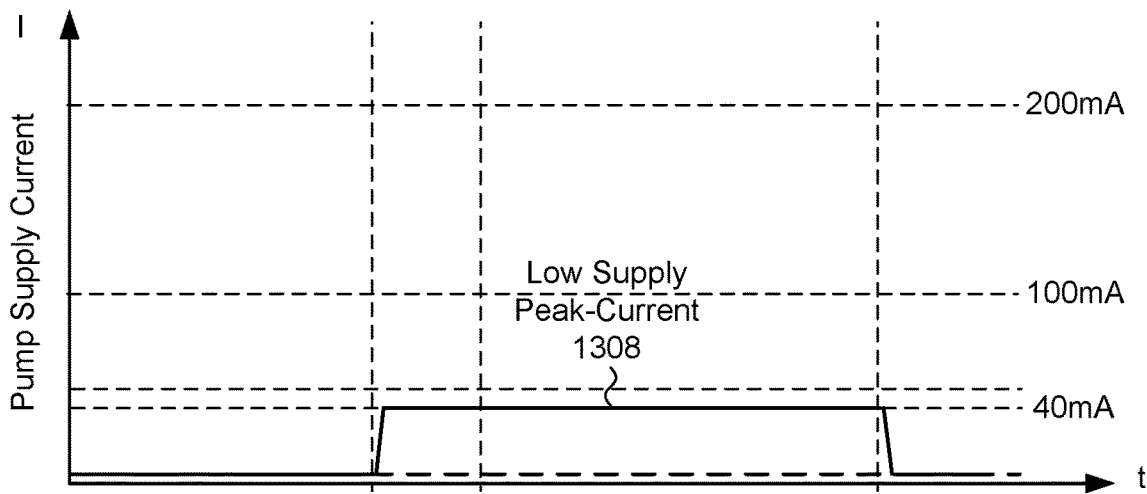
FIG. 13B is a wave diagram illustrating supply current to the DC-DC converter of FIG. 12.
Figure 13C:
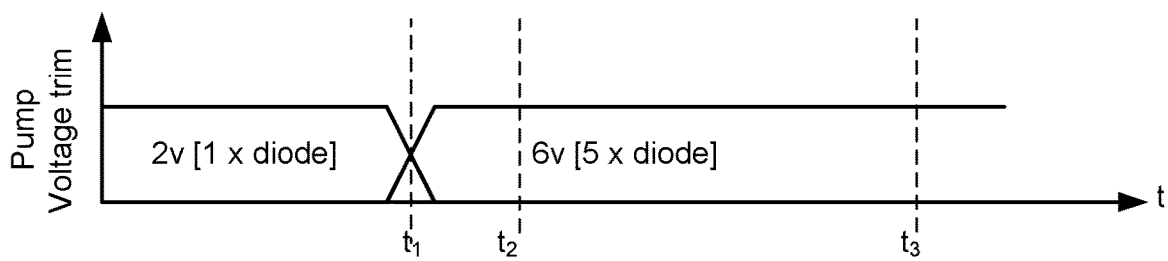
FIG. 13C is a wave diagram illustrating a digital voltage trim control to the DC-DC converter of FIG. 12, which causes the charge-pump to ramp-up 4 volts.
Figure 14A:
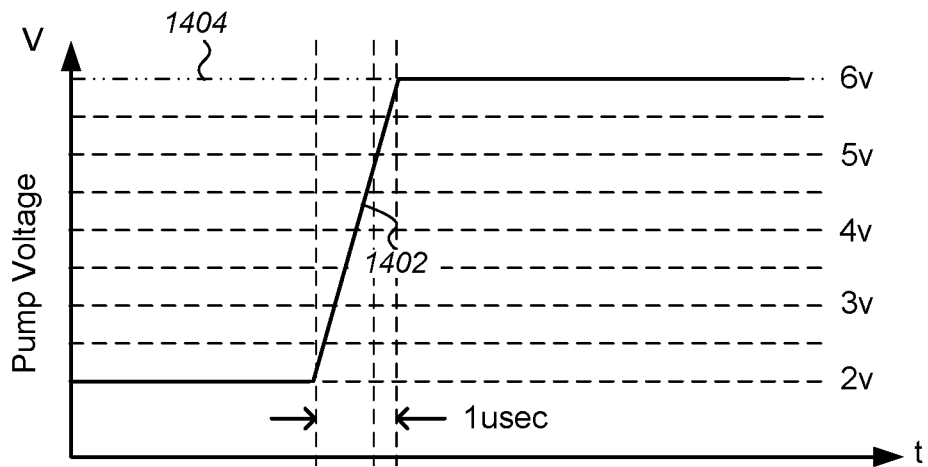
FIG. 14A is a wave diagram illustrating an output voltage of a conventional DC-DC converter including only a voltage-level regulation circuit.
Figure 14B:
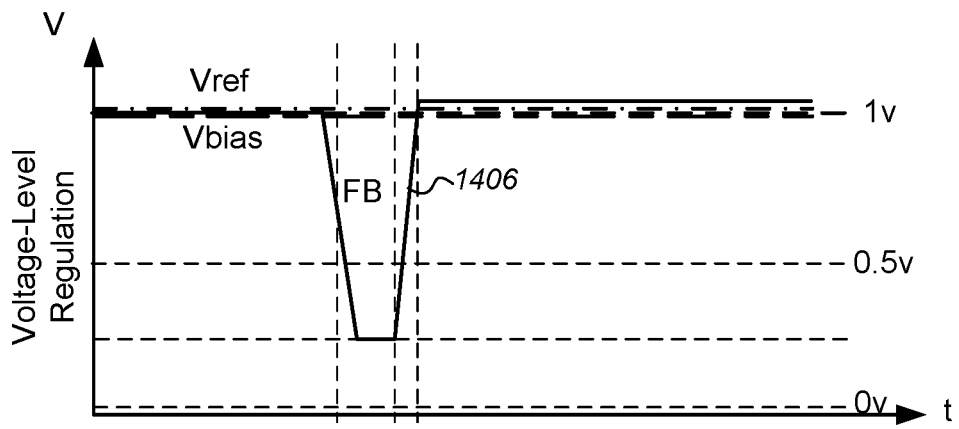
FIG. 14B is a wave diagram illustrating a bias voltage (Vbias) applied to the conventional DC-DC converter, and a feedback voltage (Vfb) and a reference voltage (Vref) to inputs of a comparator in the conventional DC-DC converter during a voltage transition.
Figure 14C:
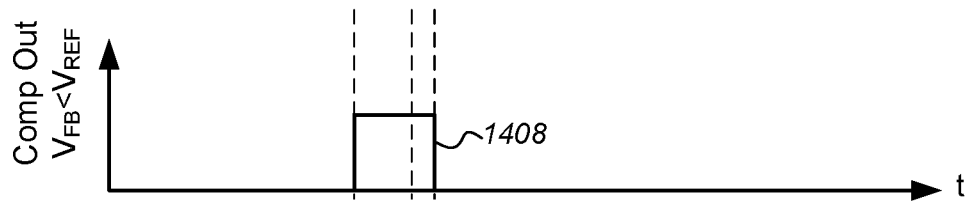
FIG. 14C is a wave diagram illustrating an output signal from the comparator to the conventional DC-DC converter based on Vfb relative to Vref to control a charge-pump in the DC-DC converter ramp.
Figure 14D:
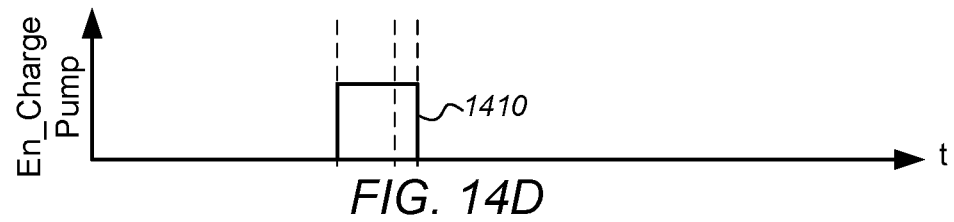

FIGS. 13A to 13C are wave diagrams illustrating output voltage from and supply current to the DC-DC converter of FIG. 12. In particular, FIG. 13A shows the output or pump voltage from the charge-pump 1204 for a 4V ramp-up or positive slope transition from 2V to about 6 VDC. Referring to FIG. 13A it is seen that the ON-OFF operation of the charge-pump 1204 by the positive slope-detector 1202 results in a limited voltage slope (indicated by line 1302) having an idealized slope (indicated by dashed line 1304) of DV/DT or 4V/5 µsec. Thereafter, the pump voltage is regulated by the voltage-level-detector 1206 beginning at the time indicated by reference numeral 1306.

Referring to FIG. 13B it is further noted that limited voltage slope results in a substantially lower, and more uniform supply peak current (indicated by line 1308) of about 40 mA throughout the entire transition. This is in contrast to the high supply peak-current of about 200 mA shown previously in FIG. 2B for a similar 4V transition using a conventional DC-DC converter lacking the slope-detector 1202 of FIG. 12.

FIG. 13C is a wave diagram illustrating a digital voltage trim control to the DC-DC converter of FIG. 12, which causes extra 4 diodes in the diode-stack 1218 to switch "on" shifting the steady state target voltage of the feedback signal (VFB) to the comparator by 4V, and causing the charge-pump to begin to ramp-up the output voltage by the same added voltage magnitude of this of the switched "on" diodes (diode is switched "on" when the switch that shorts it opens and allows its voltage to be added to the total accumulated voltage of the diode-stack). Referring to FIGS. 13A to 13C it is seen that at about time t1 the trim signal causes 4 additional diodes to switch on and causing the charge-pump to begin to ramp-up the output voltage from 2V to 6V.

FIGS. 14A to 14D are wave diagrams illustrating output voltage, voltage level regulation, comparator inputs Vref/FB, diode-stack reference Vbias, comparator output which is the direct charge-pump enable signal, for a fast corner conventional on/off DC-DC converter during a 4V transition. The voltage regulation in the conventional DC-DC converter (not shown), which has only voltage-level regulation, is based on an "on"/"off" operation of a voltage-level-detector. The voltage-level-detector of the conventional DC-DC converter consists of a diode-stack and a comparator that stops the charge-pump whenever an output or pump voltage (indicated by line 1402 in FIG. 14A) exceeds a target voltage regulation level 1404 of 6V, and resumes charge-pump operation whenever the pump voltage goes below the target voltage regulation level. The diode-stack of the conventional DC-DC converter converts or shifts the pump voltage to a feedback (FB) voltage ($V_{FB}$), indicated by line 1406 in FIG. 14B, which is compared with or to a reference voltage Vref to generate a comparator output signal (Comp Out 1408 in FIG. 14C) when $V_{FB}$<Vref that is or is used to generate a charge pump enable signal (En_Charge Pump 1410 in FIG. 14D).

Figure 15A:
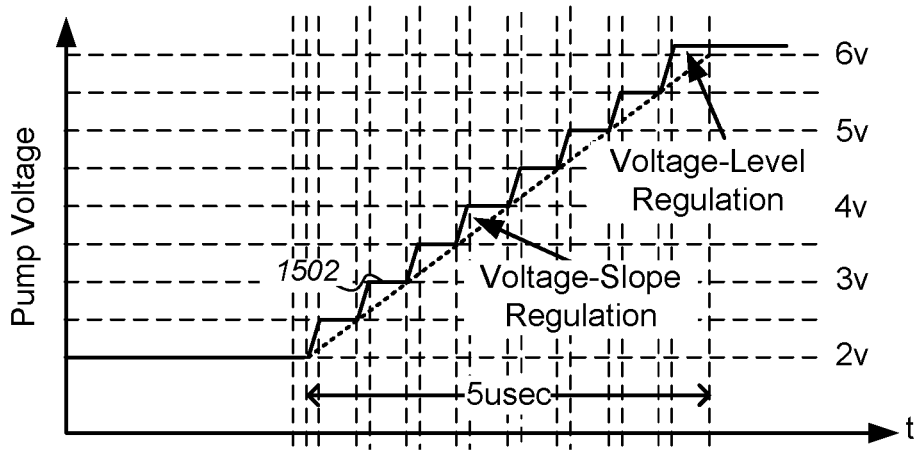
FIGS. 15A to 15E are wave diagrams illustrating output voltage, voltage level regulation, comparator output and a charge-pump enable signal for a DC-DC converter including both voltage-level and voltage-slope regulation circuits.
Figure 15B:
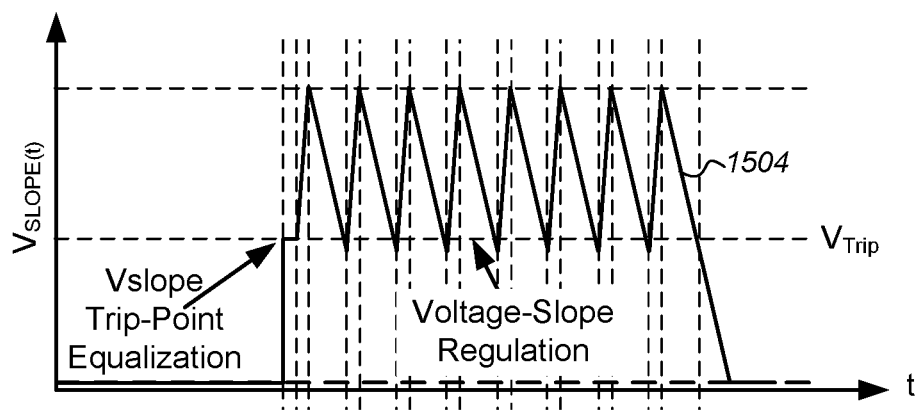
Figure 15C:
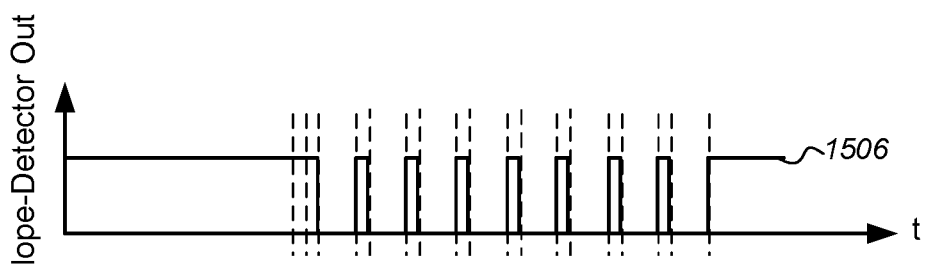
Figure 15D:
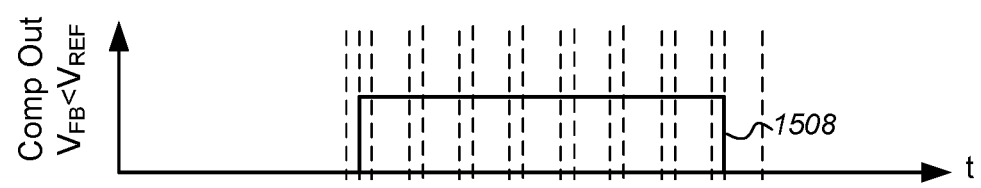
Figure 15E:
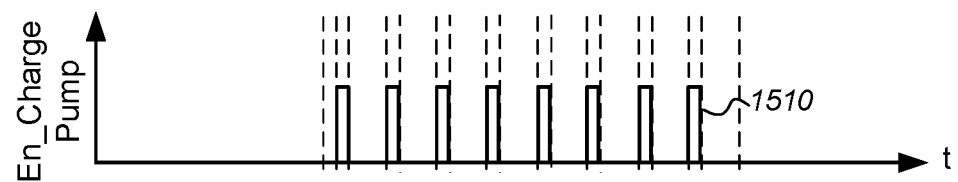

FIGS. 15A to 15E are wave diagrams illustrating output voltage, voltage level regulation, comparator inputs and output, and a charge-pump enable signal for a DC-DC converter including both voltage-level and voltage-slope-regulation-loops, such as that shown in FIG. 12. In particular, FIG. 15A illustrates an output or pump voltage 1502 during a 4V transition using a DC-DC converter, such as shown in FIG. 12, having both a voltage-level-regulation-loop and a slope-regulation-loop. FIG. 15B illustrates a voltage of $V_{SLOPE}$ ($V_{SLOPE}(t)$ 1504) during the transition, FIG. 15C illustrates an output of the slope-detector 1506, FIG. 15D illustrates an output of the voltage-level-detector 1508, and FIG. 15E illustrate a pump enable signal 1510 to the charge-pump during the transition. Referring to FIGS. 15A to 15E it is seen that in contrast to a conventional DC-DC converter, whenever the pump output exceeds a maximum voltage-slope or $SLOPE_{MAX}$ the voltage of $V_{SLOPE}$ ($V_{SLOPE}$(t) 1504) exceeds $V_{TRIP}$ the slope-regulation-loop stops the charge-pump by removing the pump enable signal 1510. The charge-pump operation resumes after a wait time, determined by the integration time needed for a voltage magnitude of $V_{SLOPE}$ to drop to less than a voltage magnitude of $V_{TRIP}$ as described previously. The voltage slope-detector re-asserts the pump enable signal 1510 resuming the charge-pump operation and resulting in the stepped output seen of the pump voltage 1502 seen in FIG. 15A. This ON-OFF operation continues until a target output voltage of 6V is achieved and the charge-pump operation is stopped by the voltage-level regulation. When the target voltage is achieved and the charge-pump is stopped, the slope-regulation-loop saturates, and the pump voltage 1502 is regulated by the voltage-level-regulation-loop using a feedback voltage ($V_{FB}$) provided by the diode-stack (shown as diode-stack 1218 in FIG. 12) and compared in the voltage-level-detector to the reference voltage (Vref). Once the output pump voltage 1502 is steady at the target voltage, i.e., VFB>Vref, and output of the voltage-level-detector 1508 drops, removing the pump enable signal 1510.

Figure 16:
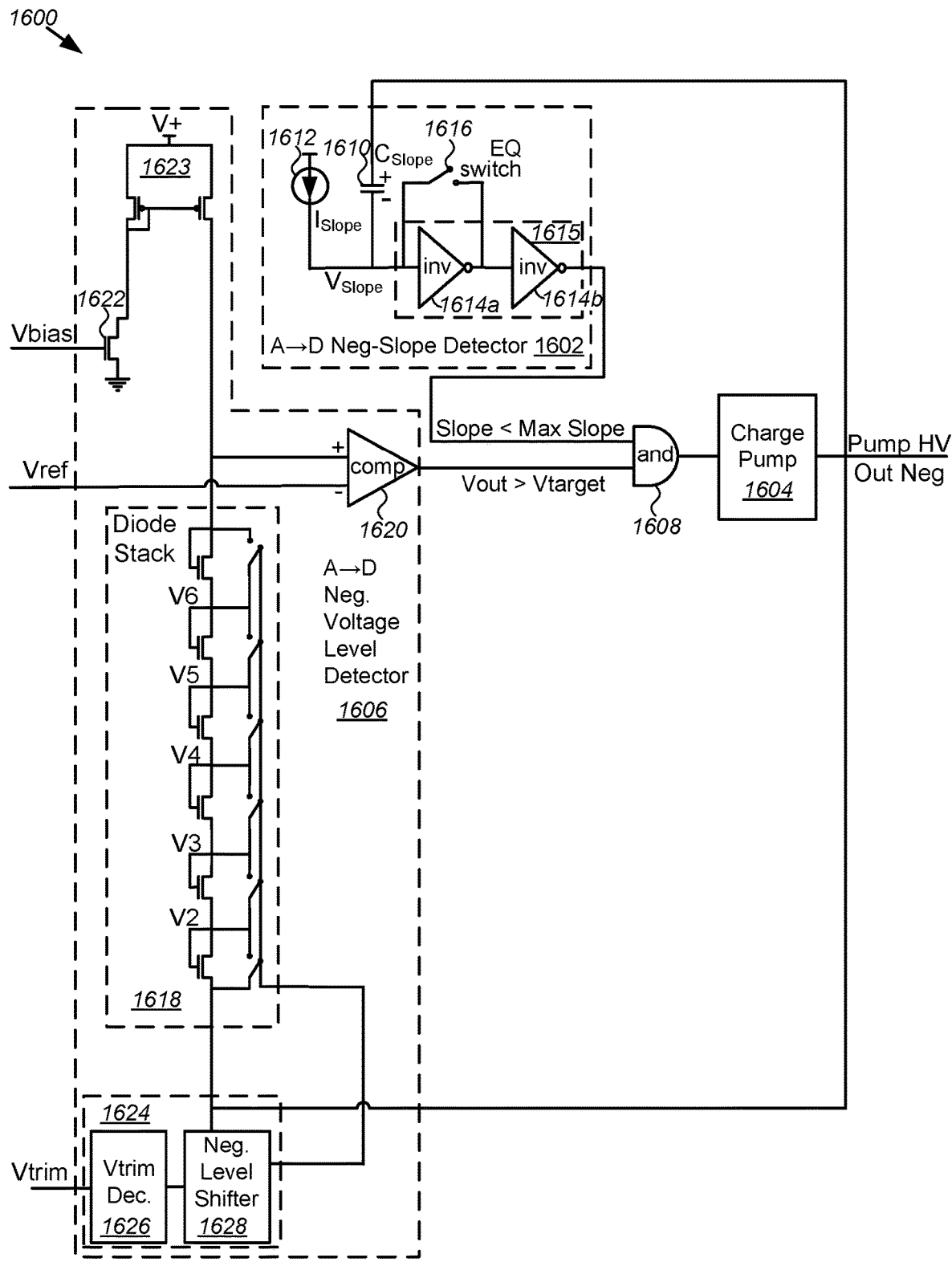
FIG. 16 is a schematic block diagram of a DC-DC converter including a charge-pump and both voltage-level-detector and a negative slope-detector.

FIG. 16 is a schematic block diagram of another embodiment of a DC-DC converter 1600 including a negative slope-detector 1602. The DC-DC converter 1600 in addition to the slope-detector 1602 includes a charge-pump 1604, voltage-level-detector 1606 and a logic gate 1608, such as the AND gate shown, to enable the slope-detector to regulate a slope of the pump HV output while the voltage-level-detector regulates the voltage of the pump HV output.

This logic gate 1608 combines outputs of two different regulation-loops, a voltage-level-regulation-loop and a voltage slope-regulation-loop, into a single logic signal that enables or disables operation of the charge-pump 1604. The AND function is used in this case since both regulation-loops allow the charge-pump 1604 to operate until a regulation parameter limit is crossed, either voltage-level or voltage-slope. The voltage-level regulation-loop stops the charge-pump 1604 output ramp-down when the output voltage exceeds a target voltage-level. Charge-pump 1604 operation resumes when output voltage crosses back above the target voltage-level—hence, an ON-OFF voltage-regulation. The voltage-slope regulation stops the charge-pump 1604 output ramp-down when the output ramp-down voltage-slope exceeds a target ramp-down-slope. Charge-pump 1604 operation resumes after a slope-driven wait period—hence, an ON-OFF slope regulation.

The charge-pump 1604 can include any suitable charge-pump capable of providing a minimum desired negative output voltage and being controlled by on/off operation using a digital signal or pulse. In the embodiment shown in which the DC-DC converter 1600 is a negative DC-DC converter the charge-pump 1604 is an unregulated, negative charge-pump. By unregulated it is meant that the charge-pump 1604 itself include no internal regulator for either slope or voltage output, and therefore begins ramping-down to the minimum voltage the negative charge-pump is capable of producing.

In the embodiment shown the slope-detector 1602 is an A→D negative slope-detector. Referring to FIG. 16, the slope-detector 1602 includes a feedback or integration capacitor 1610 having a first terminal coupled to the pump HV output of the DC-DC converter 1600 to form a voltage slope-regulation-loop, a current source 1612 coupled between a second terminal of the capacitor and a positive voltage source, and two serial inverters 1614a, 1614b, as a comparator 1615. In addition in the embodiment shown the slope-detector further includes an equalization (EQ) switch 1616 coupled between an input and output of a first inverter 1614a. The EQ switch 1616, which can be controlled either manually by a user or automatically by an external system in which the DC-DC converter 1600 is used, enables the comparator 1615 to be reset to its trip-point, thereby enabling faster or near instantaneous operation of the slope-detector 1602. EQ switch is closed whenever $V_{SLOPE}$ is too far from $V_{TRIP}$ such as in cases where the output was stable and only starts ramping, and the slope-detector is saturated. As with the slope-detectors described previously herein the predetermined maximum slope ($SLOPE_{MAX}$) is proportional to $I_{SLOPE}/C_{SLOPE}$, and, because the integration capacitor and current source are integrally formed on a single IC chip, is constant over substantially all PVT conditions. The time for which the voltage transition is interrupted ($T_{SLOPE\text{-}WAIT}$) is an integration time needed for a slope indication voltage ($V_{SLOPE}$) of pump HV Out to rise to more than a magnitude of $V_{TRIP}$ and is equal to:

$$T_{SLOPE\text{-}WAIT} = [C_{SLOPE} \times |V_{SLOPE}V_{TRIP}|/I_{SLOPE}]$$

The voltage-level-detector 1606 is an A→D negative voltage-level-detector and in the embodiment shown includes a diode-stack 1618, a comparator 1620, a reference voltage (Vref), and a bias voltage (Vbias). Vref represents or is related to a shifted or desired target output voltage from the DC-DC converter 1600. Vbias is coupled to a gate of an n-channel transistor 1622 with same Width/Length as the n-channel devices in the diode-stack 1618, which forms a constant current source which the diode-stack is coupled to through a current mirror 1623, for adjusting a feedback (FB) voltage (VFB). The diode-stack 1618 converts or shifts the charge-pump output voltage (Pump HV Out Neg) to the feedback voltage (VFB) relative to the charge-pump 1604 output voltage, and the comparator 1620 compares this VFB with Vref. It is noted that in this voltage-regulation scheme the comparator 1620 digitally controls the operation of the charge-pump 1604 based on the analog data of its inputs, FB and Vref, respectively. When the charge-pump 1604 output voltage (Pump HV Out Neg) is higher than the target voltage, the VFB input of the comparator 1620 is higher than Vref and the comparator enables the charge-pump to ramp-down to the desired or target negative output voltage, subject only to regulation by voltage-slope-regulation-loop.

Additionally in some embodiments, such as that shown, the voltage-level-detector 1606 further includes a voltage trimming circuit 1624 to receive a voltage trim signal (Vtrim) and feedback from the output of the charge-pump 1604, and in response thereto to control switches in the diode-stack 1618 to adjust or trim the pump HV Out Neg. Generally, the voltage trimming circuit 1624 includes a voltage trim decoder 1626 and a level shifter 1628. The voltage trim decoder 1626 changes a digital or binary Vtrim signal to a low voltage (LV) analog signal. The level shifter 1628 receives the LV analog signal from the voltage trim decoder 1626 as well as a HV Neg feedback signal from the output of the charge-pump 1604, and combines and shifts a level of these signals to yield a voltage trimming signal used to control switches in the diode-stack 1618.

Figure 17:
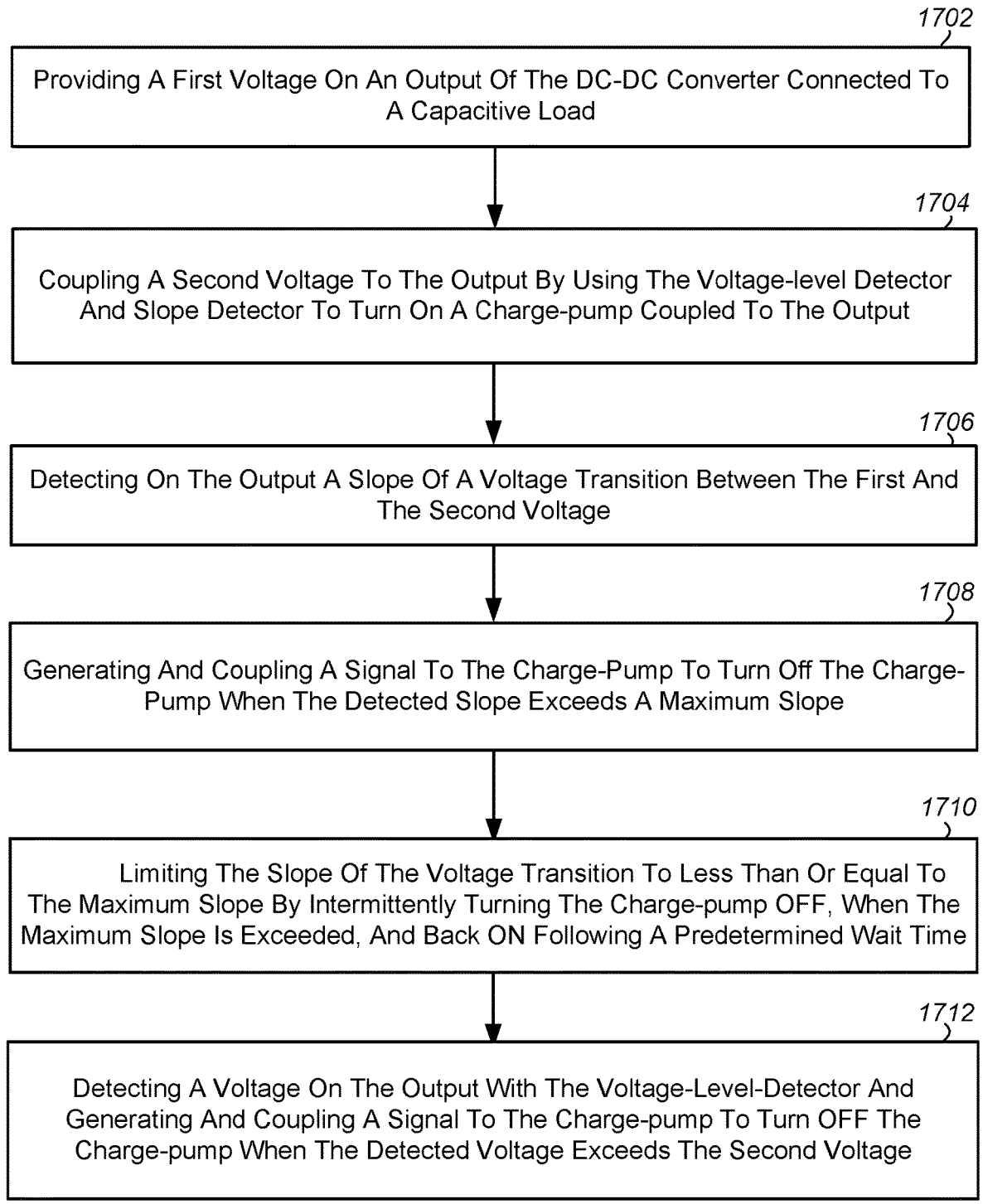
FIG. 17 is a flow chart of a method for operating a DC-DC converter including a charge-pump and both voltage-level-detector and a slope-detector.

FIG. 17 is a flow chart of a method for operating a DC-DC converter, such as those described in FIGS. 12 and 17, including a charge-pump and both voltage-level-detector and a slope-detector. Referring to FIG. 17 the method begins with providing a first voltage on an output of a DC-DC converter connected to a capacitive load (1702). Next, a second voltage is coupled to the output by using the voltage-level-detector and slope-detector to turn on a charge-pump coupled to the output (1704). Generally, this is accomplished using both the voltage-level-detector and slope-detector to turn on a charge-pump coupled to the output. A slope of the voltage transition is then detected on the output by the slope-detector (1706), and a signal generated in the slope-detector is coupled to the charge-pump to turn off the charge-pump when an absolute value of the detected slope exceeds a predetermined maximum slope (1708). The slope of the voltage transition is then limited to less than or equal to the predetermined maximum slope by turning the charge-pump OFF, intermittently interrupting the voltage transition (1710) when an absolute value of the maximum slope is exceeded, and back ON following a predetermined wait time. Finally, a voltage on the output is detected using the voltage-level-detector and a signal generated in the voltage-level-detector and coupled to the charge-pump to turn off the charge-pump when the detected voltage exceeds the second voltage (1712).

Figure 18:
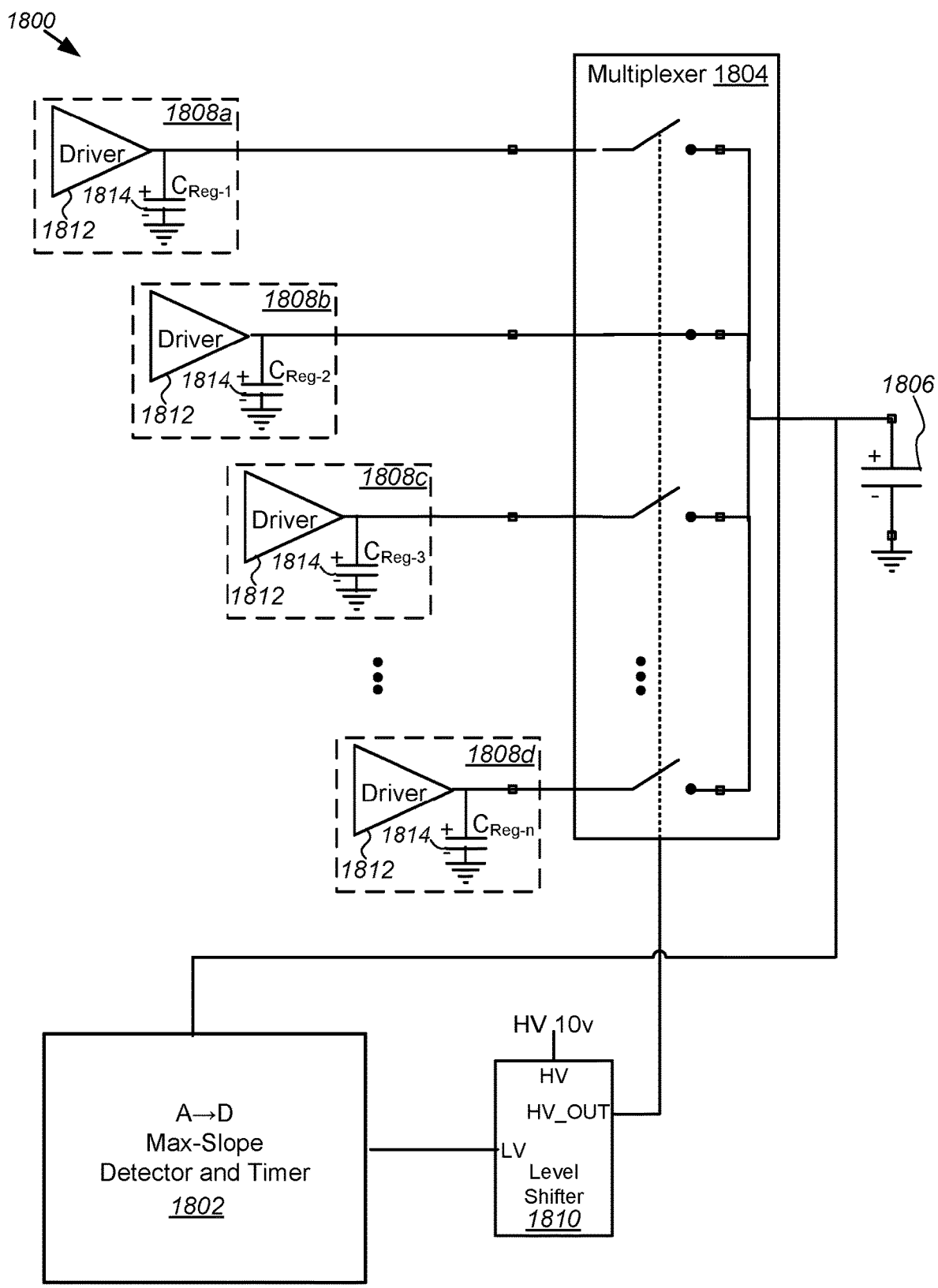
FIG. 18 is a schematic block diagram of another embodiment of a DC-DC converter including a maximum slope-detector controlling a multiplexer.

FIG. 18 is a schematic block diagram of an embodiment of another type of multiplexing DC-DC converter 1800, including a maximum slope-detector and timer 1802 controlling a multiplexer 1804 through which a load, represented here by a load capacitor 1806, on an output of the system 1800 is coupled to a number of regulated voltage sources 1808*a-d*, each capable of supplying a different voltage. In some embodiments, such as that shown, the system 1800 further includes a level shifter 1810 to convert or shift a low voltage (LV) digital signal from the maximum slope-detector and timer 1802 to a high voltage (HV) digital signal to operate one or more digitally controlled switches in the multiplexer 1804 to couple one of the regulated voltage sources 1808*a-d* to the load capacitor 1806 connected or coupled to the converter output. Each of the regulated voltage sources 1808*a-d* receive a voltage or power from a supply (not shown) external to the system 1800, and generally include a one or more drivers 1812 and load capacitors 1814, and are configured to provide different voltages (V1-Vn).

The maximum slope-detector and timer 1802 limits the slope or rate of transition of the output to less than a predetermined slope or transition-time. In particular, the maximum slope-detector and timer 1802 limits the slope by controlling a frequency and duration of ON-OFF pulses used to operate the digital switches in the multiplexer 1804. Generally, the maximum slope-detector and timer 1802 can include any of the positive, negative or combined positive/negative slope-detectors described previously herein with reference to FIG. 5, 7, 8 or 9. Finally, as with the combined positive/negative slope-detectors of FIGS. 8 and 9, where the maximum slope-detector and timer 1802 includes a combined positive/negative slope-detector it is noted that the slope to which the output voltage transition is regulated or controlled need not be of the same magnitude for ramp-up and ramp-down transitions. This can be accomplished, for example, by varying the capacitance of the first and second integration capacitors where present, and/or by varying currents from the first and second current source.

Figure 19:
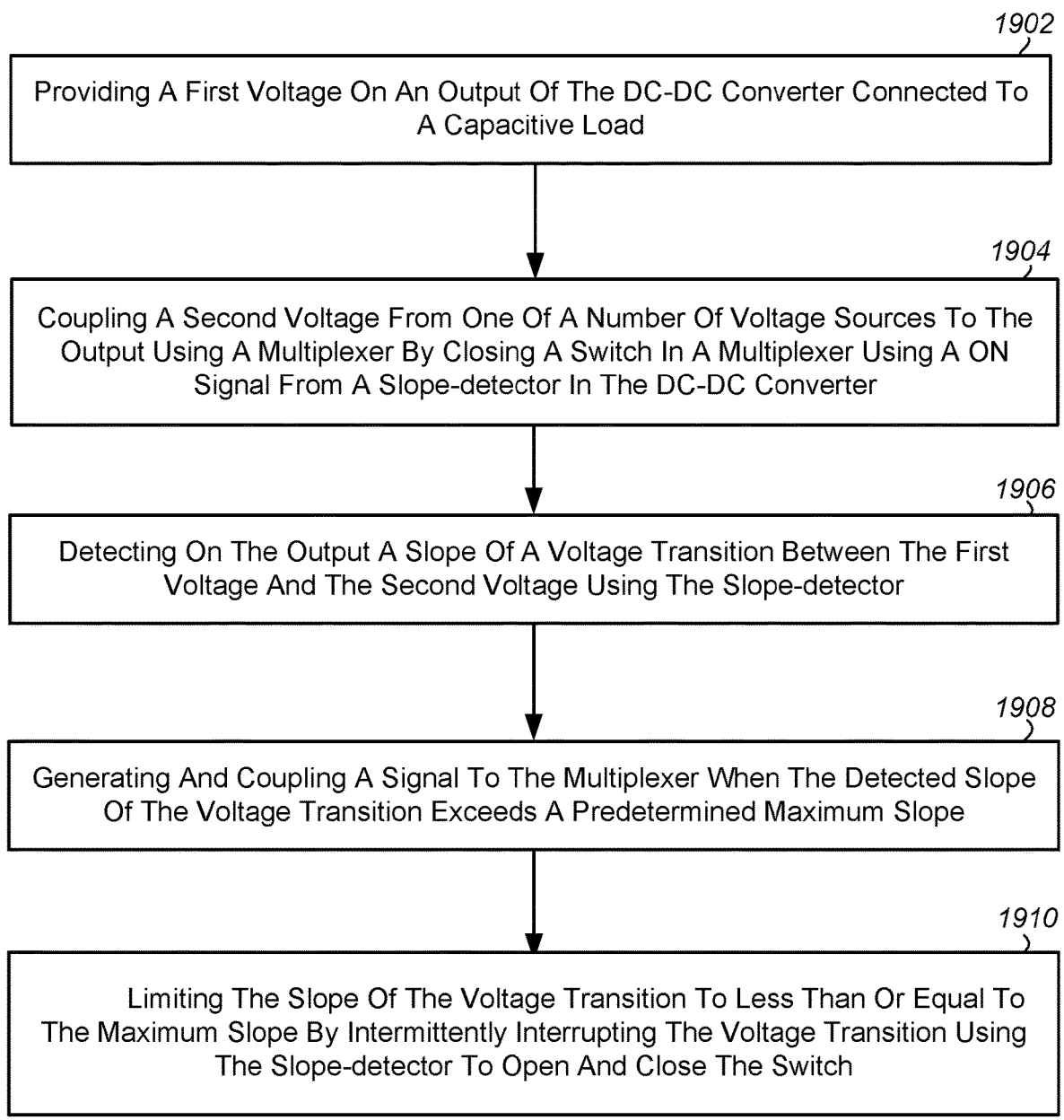
FIG. 19 is a flow chart of a method for operating a DC-DC converter including a multiplexer and a slope-detector.

FIG. 19 is a flow chart of a method for operating a multiplexing DC-DC converter or a multiple voltage source multiplexing system including a multiplexer and a slope-detector, such as that described above with reference to FIG. 18. Referring to FIG. 19 the method begins with providing a first voltage on an output of the system connected to a capacitive load (1902). Next, a second voltage is coupled from one of a number of voltage sources to the output using a multiplexer in the system by closing a switch in the multiplexer using an ON signal from a slope-detector (1904). A slope of the voltage transition between the first voltage and the second voltage is then detected on the output using the slope-detector (1906). Next, an OFF signal is generated in the slope-detector and coupled to the multiplexer when the detected slope of the voltage transition exceeds a predetermined maximum slope (1908). Finally, the slope of the voltage transition is limited to less than or equal to the maximum slope by intermittently interrupting the voltage transition using the slope-detector to open and close the switch in the multiplexer (1910).

Figure 20:
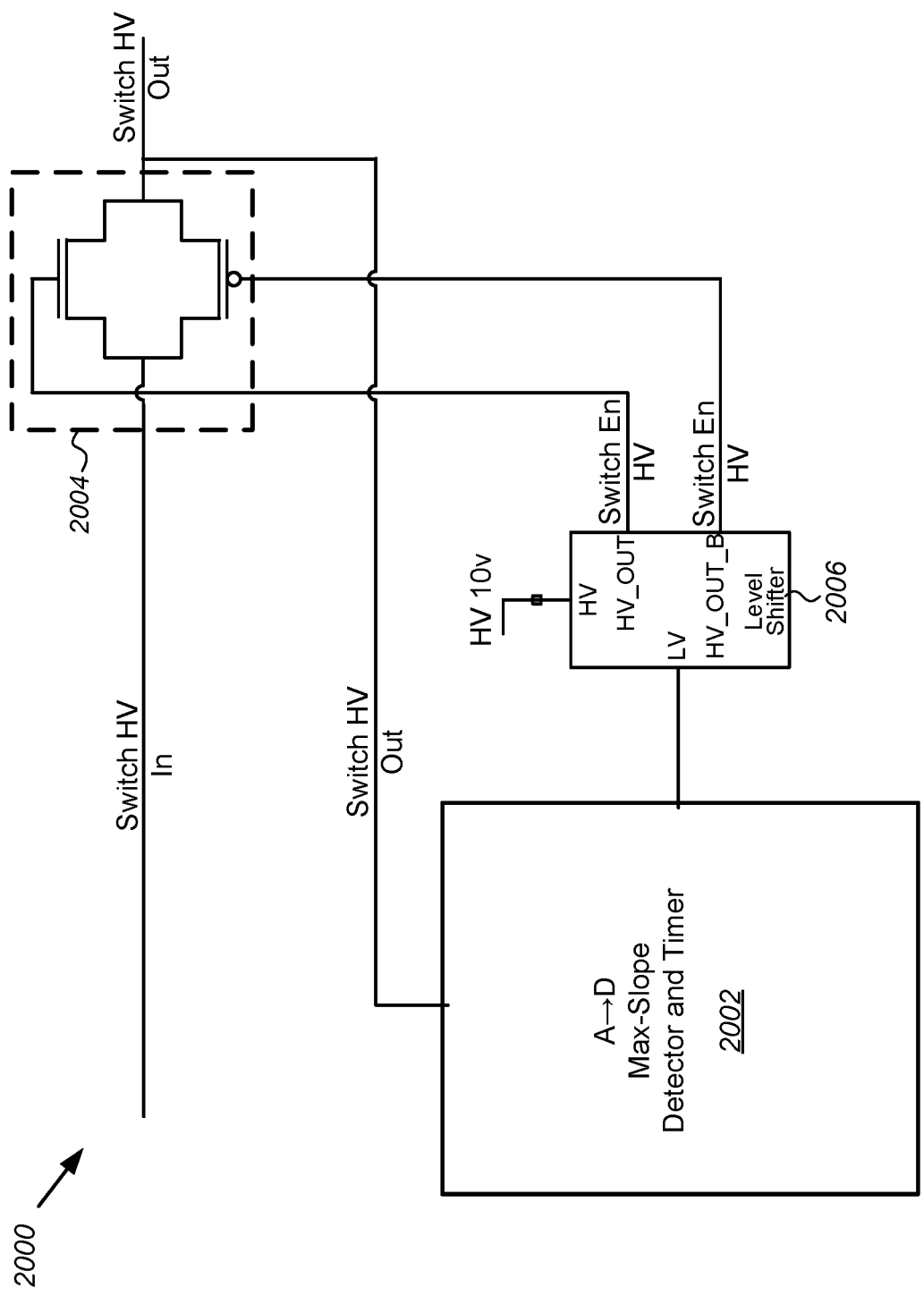
FIG. 20 is a schematic block diagram of an embodiment of a slope-limiting switch including a maximum slope-detector, level shifter and complementary metal-oxide-semiconductor (CMOS) switch.

FIG. 20 is a schematic block diagram of another embodiment of a slope-limiting switch or switching-circuit 2000 including an analog-to-digital (A→D) maximum slope-detector and timer 2002, and illustrating an implementation in which the switching-circuit includes a high voltage (HV) complementary metal-oxide-semiconductor (CMOS) switch 2004 capable of being digitally controlled, and which is connected to the slope-detector and timer to form an ON-OFF digital-slope-regulation-loop. Generally, the HV CMOS switch 2004 includes a complementary pair of matched PMOS and NMOS field effect transistors (FETs), but can include only NMOS or only PMOS or a different type of voltage conducting switching element (such as Bipolar). In the embodiment shown the switching-circuit 2000 further includes an optional level shifter 2006 that converts or shifts a low voltage (LV), digital ON-OFF signal from the maximum slope-detector and timer 2002 to generate complementary high voltage switch enable signals (Switch_En HV and Switch_En_b HV) to control the FETs of the HV CMOS switch 2004 to couple a HV applied to an input of the switch (Switch HV In) to an output (Switch HV Out) while limiting the slope or rate of transition of the voltage on the output. The maximum slope-detector and timer 2002 includes analog elements or circuits and, in some embodiments logic elements that enable the slope-detector and timer to determine if a slope ($V_{in\text{-}Slope}$) of a voltage transition between a first voltage on the output and a second voltage is less than a predetermined maximum slope ($Slope_{MAX}$). If the slope of the voltage transition is less than the maximum slope ($V_{in\text{-}Slope} < Slope_{MAX}$) an ON is output to close the HV CMOS switch 2004. If however the slope of the voltage transition is greater than the maximum slope ($V_{in\text{-}Slope} > Slope_{MAX}$) an OFF is output to open the HV CMOS switch 2004 interrupting the voltage transition for a slope-dependent delay or wait time, after which the switch is again turned ON or closed. As with the embodiments described previously, the maximum slope-detector and timer 2002 can include a positive, negative or combined positive/negative slope-detector.

Figure 21:
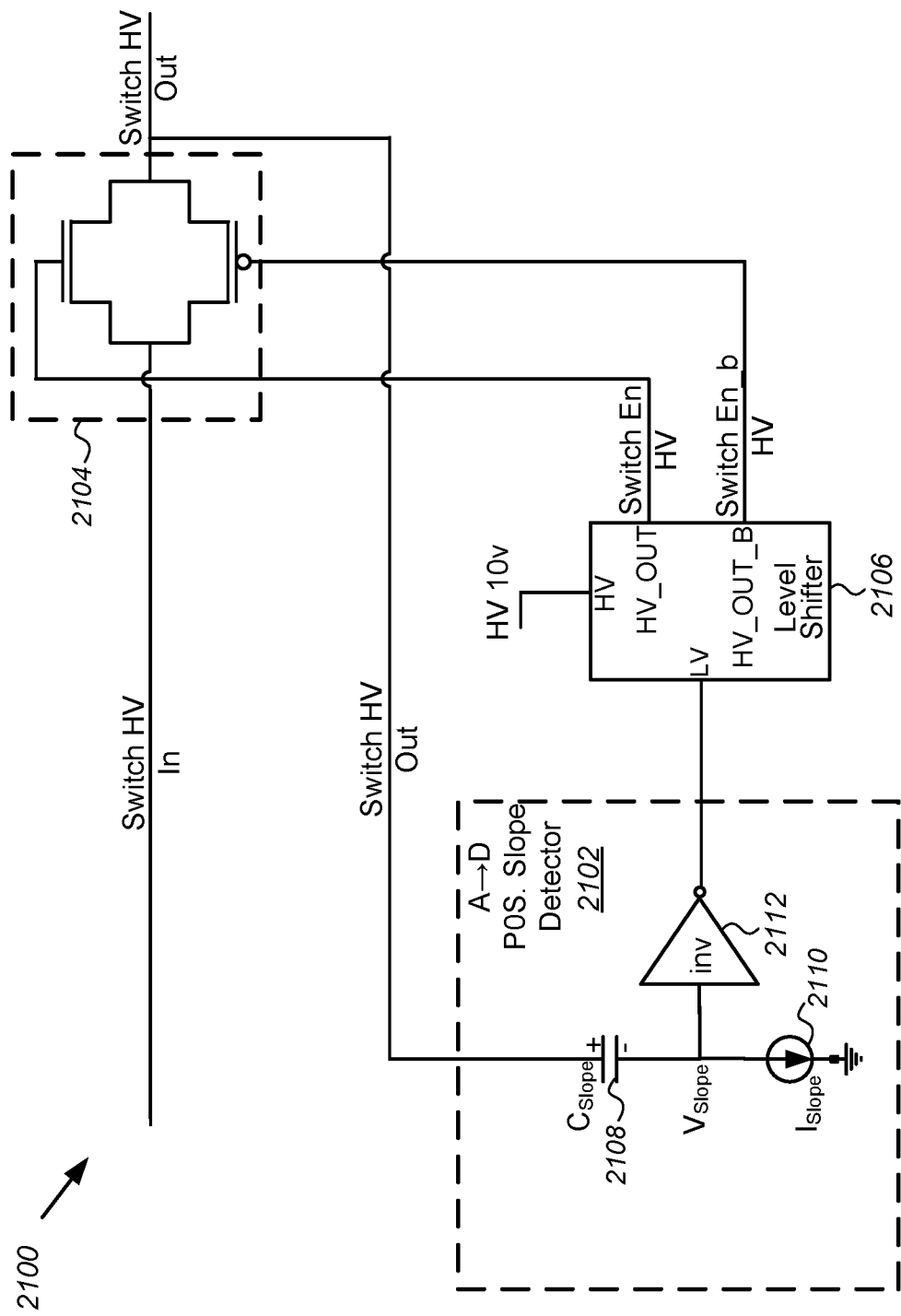
FIG. 21 is a schematic block diagram of an embodiment of the slope-limiting CMOS switch of FIG. 20 including a positive maximum slope-detector.

FIG. 21 is a schematic block diagram of an embodiment of the slope-limiting switching-circuit 2000 of FIG. 20 including an analog-to-digital (A→D) positive maximum slope-detector 2102. Referring to FIG. 21 the slope-limiting switching-circuit 2100 further includes a HV CMOS switch 2104 through which input of the switch (Switch HV In) is couple to an output (Switch HV Out), while the positive maximum slope-detector 2102 controls or operates the HV CMOS switch 2104 to limit the slope or rate of transition of the voltage on the output, and a level shifter 2106 to convert or shift the LV digital ON-OFF signal from the maximum slope-detector and timer to complementary HV switch enable signals (Switch_En HV and Switch_En_b HV). In the embodiment shown, the positive slope-detector 2102 includes a feedback or integration capacitor 2108 having a first terminal coupled through an input of the slope-detector 2102 to the output of the slope-limiting switching-circuit 2100, a current source 2110 coupled between a second terminal of the capacitor 2108 and ground, and a single inverter 2112, which functions as a comparator for the slope-detector.

Figure 22A:
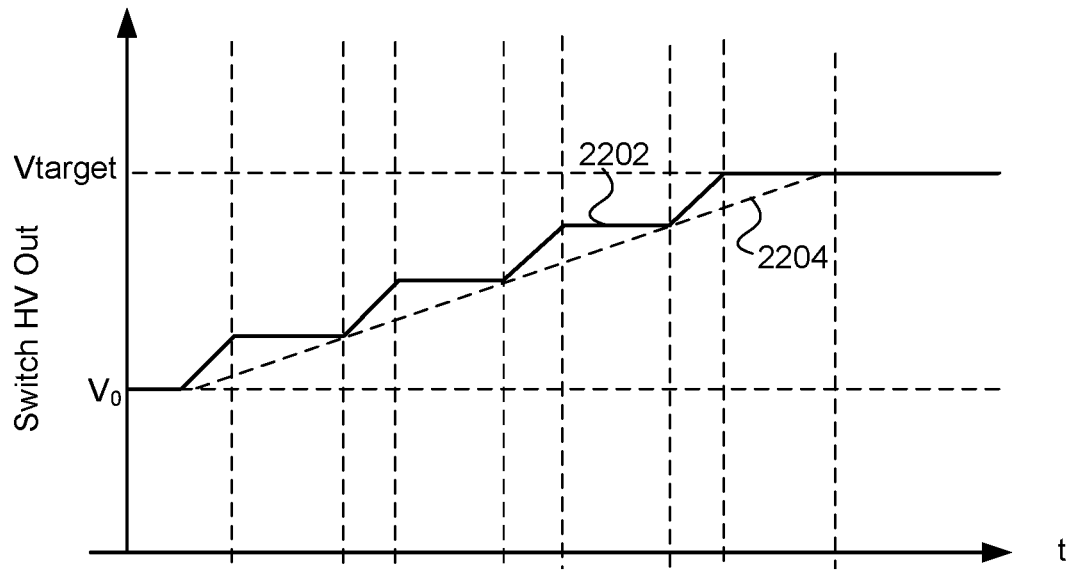
FIGS. 22A to 22C are wave diagrams illustrating output voltage, voltage ($V_{slope}$) on a node in the slope-detector and switch enable signals for the slope-limiting CMOS switch of FIG. 21.
Figure 22B:
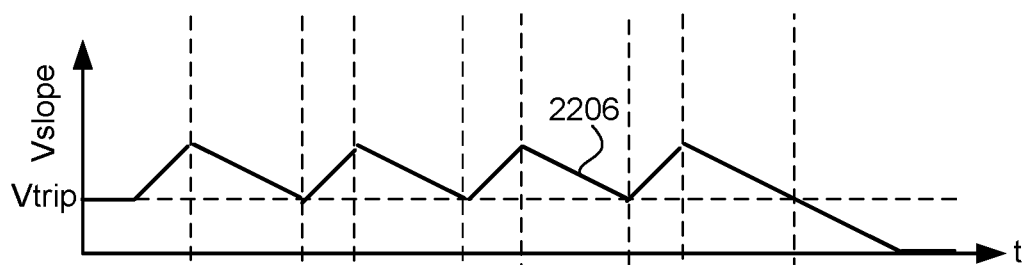
Figure 22C:
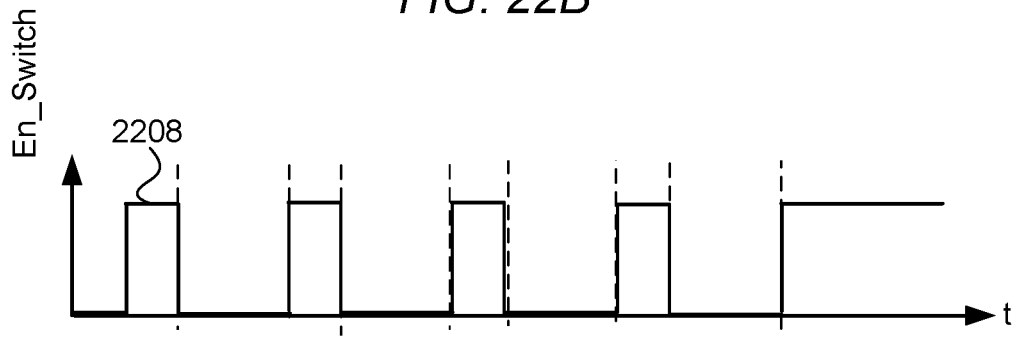

FIGS. 22A to 22C are wave diagrams illustrating output voltage, voltage ($V_{slope}$) on a node in the slope-detector and switch enable signals for the slope-limiting CMOS switch of FIG. 21. In particular, FIG. 22A illustrates the slope limited transition of Switch HV Out (indicated by line 2202) from an initial voltage ($V_0$) to a target voltage (Vtarget), having an idealized slope (indicated by dashed line 2204). FIG. 22B illustrates the signal $V_{SLOPE}$ 2206 at an input to the inverter 2112, and illustrates that when the ramp-up slope is higher than a maximum allowed slope $SLOPE_{MAX}$ of the slope-detector 2102, the slope-detector stops the switch operation by withdrawing or de-asserting an enable switch signal 2208 to the level shifter 2106 and interrupting the output transition for a slope dependent wait time. Referring again to FIG. 22A it is seen that this wait time is substantially the same time needed for the idealized slope 2204 to cross with the previously interrupted voltage transition of Switch HV Out 2202.

Figure 23:
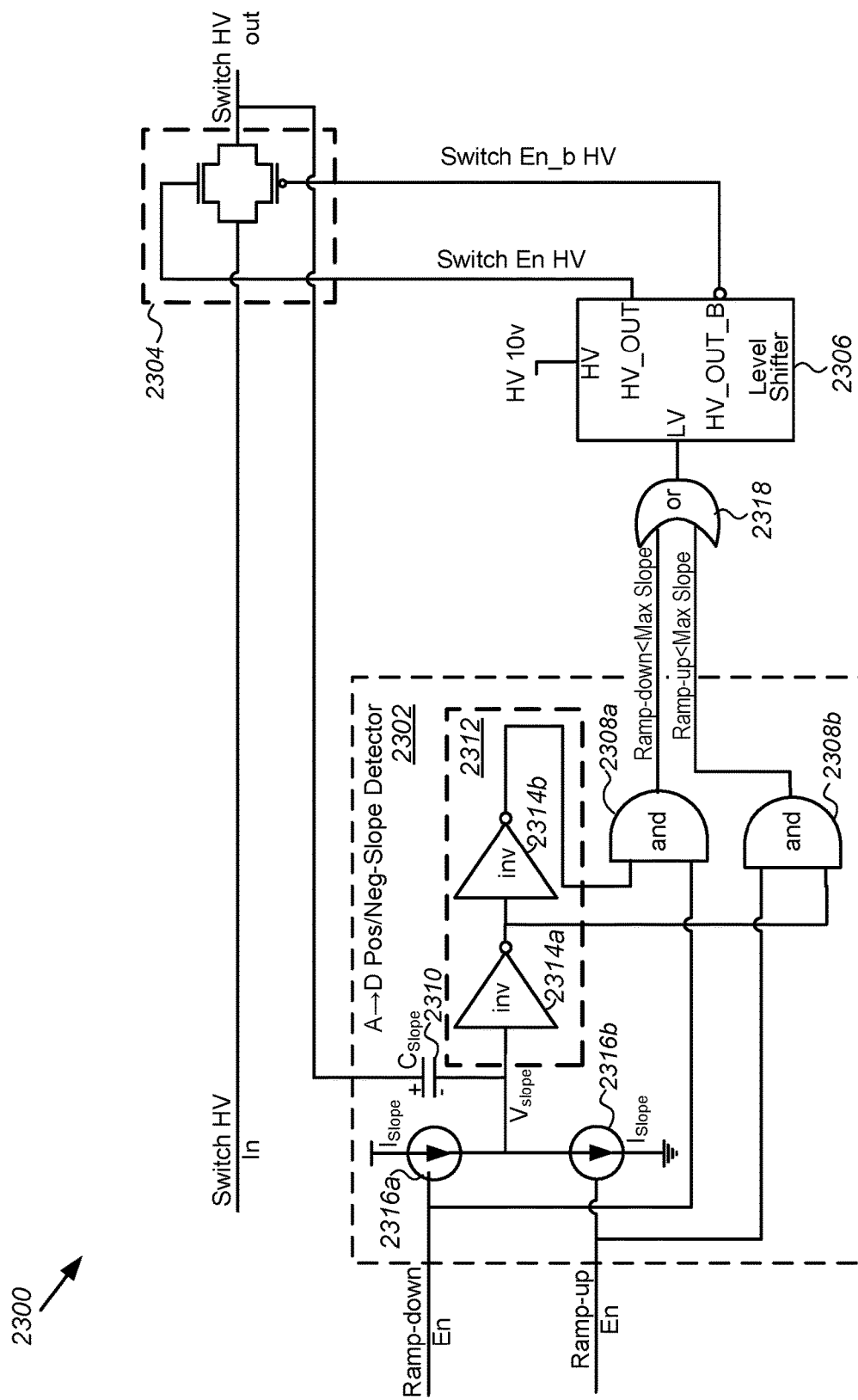
FIG. 23 is a schematic block diagram of another embodiment of the slope-limiting CMOS switch of FIG. 20 including a combined positive and negative maximum slope-detector.

FIG. 23 is a schematic block diagram of another embodiment of the slope-limiting switching-circuit of FIG. 20 including a combined analog-to-digital (A→D) positive and negative (Pos/Neg) slope-detector 2302, a HV CMOS switch 2304 capable of being digitally controlled by the Pos/Neg slope-detector, and a level shifter 2306 to convert or shift the LV digital ON-OFF signal from the maximum slope-detector and timer to complementary HV switch enable signals (Switch_En HV and Switch_En_b HV). The Pos/Neg slope-detector 2302 is similar to the Pos/Neg slope-detector 800 described with respect to FIG. 8 and requires a user to select a transition direction of the input signal, either positive or negative. Referring to FIG. 23 the Pos/Neg slope-detector 2302 is a combination of a positive slope-detector and negative slope-detector described previously in FIGS. 5 and 7 with the addition of logic gates or elements 2308a, 2308b, and generally further includes an integration capacitor 2310 having a first terminal coupled to an input of the detector, a comparator 2312 including first and second serially connected inverters 2314a, 2314b, and first and second current sources 2316a, 2316b, serially connected between a positive voltage source and ground.

In operation, when the user selects a voltage transition having a ramp-down or negative slope, a ramp-down enable signal (Ramp-down En) is applied to activate or enable a first current source 2316a and to enable or apply a logic "1" to a first input terminal of a first logic gate 2308a. Because the first logic gate 2308a is an AND gate the circuit functions like the negative slope-detector 700 of FIG. 7, where if the voltage of $V_{SLOPE}$ is greater than $V_{TRIP}$ of the comparator 2312 a second inverter 2314b of the comparator outputs another logic "1" to a second input terminal of the first logic gate 2308a causing a Ramp-down<Max Slope signal to be output from the Pos/Neg slope-detector 2302.

Similarly when the user selects a voltage transition having a ramp-up or positive slope, a ramp-up enable signal (Ramp-up En) is applied to activate or enable a second current source 2316b and to enable or apply a logic "1" to a first input terminal of a second logic gate 2308b. Because the second logic gate 2308b is an AND gate the circuit functions like the positive slope-detector 500 of FIG. 5, where the voltage of $V_{SLOPE}$ is less than $V_{TRIP}$ the first inverter 2314a of the comparator 2312 outputs another logic "1" to a second input terminal of the second logic gate 2308b causing a Ramp-up<Max Slope signal to be output from the Pos/Neg slope-detector 2302. Each of the outputs of the logic gates 2308a, 2308b serve as one input to an OR gate 2318, configured so that should a slope exceeding the predetermined maximum slope be detected, the OR gate outputs a Max Slope not detected or a logic "0" signal, to the level shifter 2306 causing the HV CMOS switch 2304 to open, interrupting the voltage transition on the output of the switching-circuit 2300.

Figure 24:
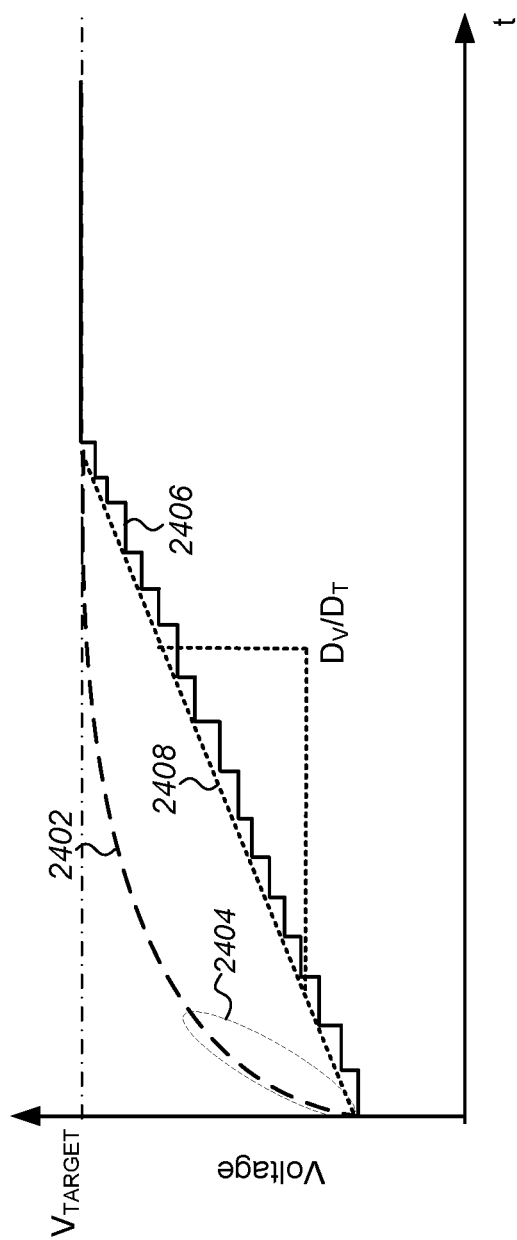
FIG. 24 is a wave diagram illustrating output voltage from the slope-limiting CMOS switch of FIG. 23 as compared to a resistance-capacitance (RC) determined output from a conventional CMOS switch.

FIG. 24 is a wave diagram illustrating output voltage from the slope-limiting CMOS switch of FIG. 23 as compared to the output from a conventional switch in which the slope of the voltage output (indicated by dashed line 2402) is determined resistance-capacitance (RC) network in the switch and typically results in a high peak current drawn from a charge-pump or voltage source, particularly at a beginning of the voltage transition, indicated by ellipse 2404. In contrast the slope-limiting CMOS switch of FIG. 23, produces an ON-OFF slope limited transition (indicated by line 2406) having an idealized slope 2408 of $D_V/D_T$ determined by and proportional to $I_{SLOPE}/C_{SLOPE}$ resulting in a substantially lower, and more uniform peak current.

Figure 25:
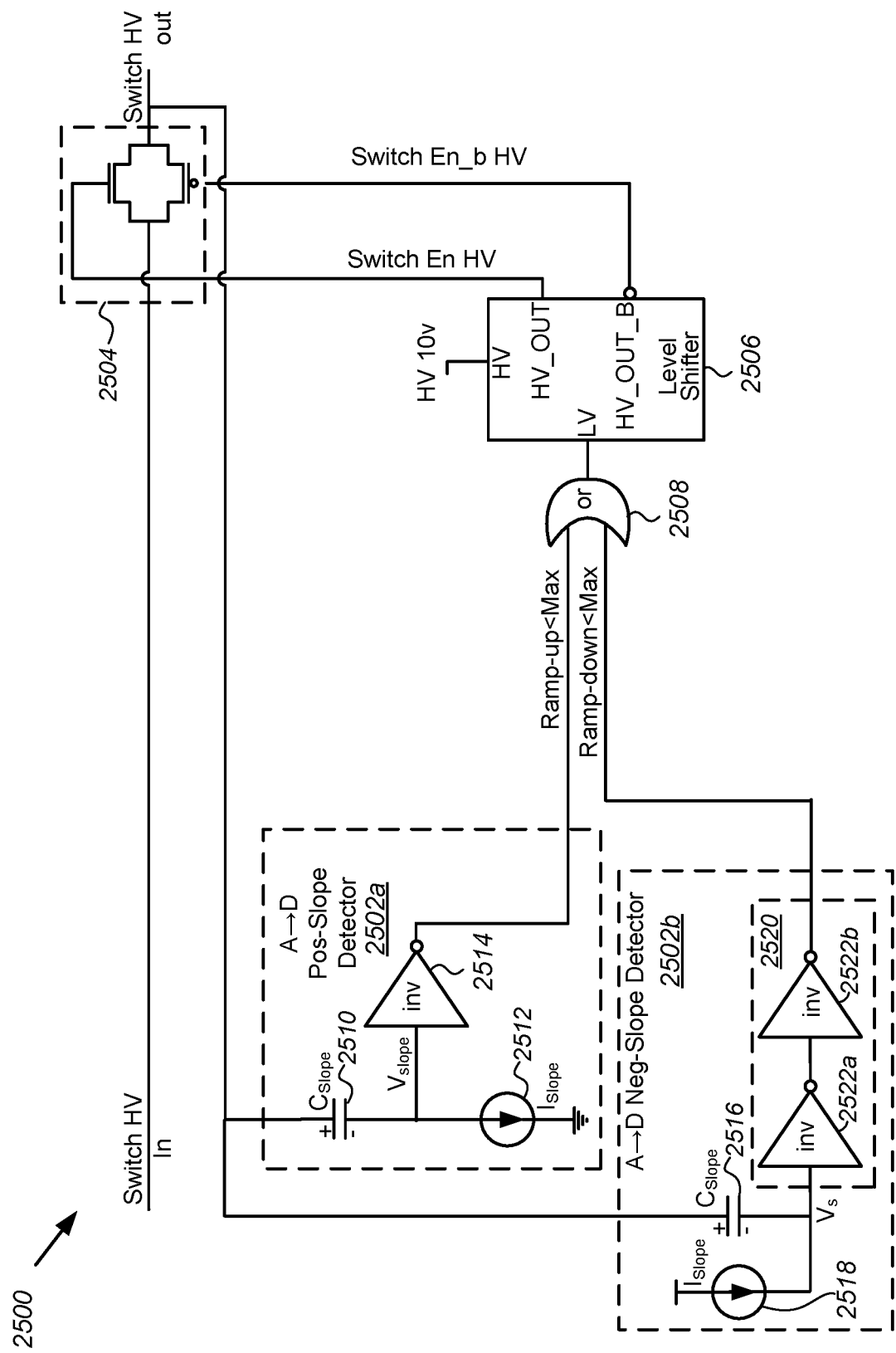
FIG. 25 is a schematic block diagram of another embodiment of the slope-limiting CMOS switch of FIG. 20 including separate positive and negative slope-detectors.

FIG. 25 is a schematic block diagram of another embodiment of a slope-limiting switching-circuit 2500 including a positive slope-detector 2502a and a separate negative slope-detector 2502b, and which does not require a user to select a transition direction of the input slope or signal. Referring to FIG. 25 the slope-limiting switching-circuit 2500 includes a HV CMOS switch 2504 through which input of the switch (Switch HV In) is couple to an output (Switch HV Out), and a level shifter 2506 to convert or shift the LV digital ON-OFF signal from the maximum slope-detector and timer to complementary HV switch enable signals (Switch_En HV and Switch_En_b HV). The slope-limiting switching-circuit 2500 further includes an OR gate 2508 configured to receive as inputs a ramp-up<max signal from the positive slope-detector 2502a and a ramp-down<max signal from the negative slope-detector 2502b so that while a slope less than the predetermined maximum slope be detected, both the positive and the negative detectors 2502a, 2502b, output a signal, generally a logic "1", to the OR gate which outputs a signal to the level shifter 2506 causing the HV CMOS switch 2504 to close or remain closed enabling the voltage output to proceed. However, should either of the positive slope-detector 2502a or the negative slope-detector 2502b detect a slope greater than the maximum slope, the affected slope-detector outputs a signal, generally a logic "0", to the OR gate 2508 which outputs a signal to the level shifter 2506 causing the HV CMOS switch 2504 to open, interrupting the voltage transition on the output of the switching-circuit 2500.

In the embodiment shown, the positive slope-detector 2502a includes a first feedback or integration capacitor 2510 having a first terminal coupled through an input of the positive slope-detector 2502a to the output of the slope-limiting switching-circuit 2500, a first current source 2512 coupled between a second terminal of the first capacitor 2510 and ground, and a single inverter 2514, which functions as a comparator for the positive slope-detector. Because of the OR gate 2508 and because the positive slope-detector 2502a outputs a ramp-up<Max Slope signal, the positive slope-detector functions similarly to the positive slope-detector 2102 of FIG. 21.

The negative slope-detector 2502b includes a second feedback or integration capacitor 2516 having a first terminal coupled through an input of the negative slope-detector 2502b to the output of the slope-limiting switching-circuit 2500, a second current source 2518 coupled between a second terminal of the second capacitor 2516 and positive voltage source, and a comparator 2520 including first and second serially connected inverters 2522a, 2522b.

Figure 26:
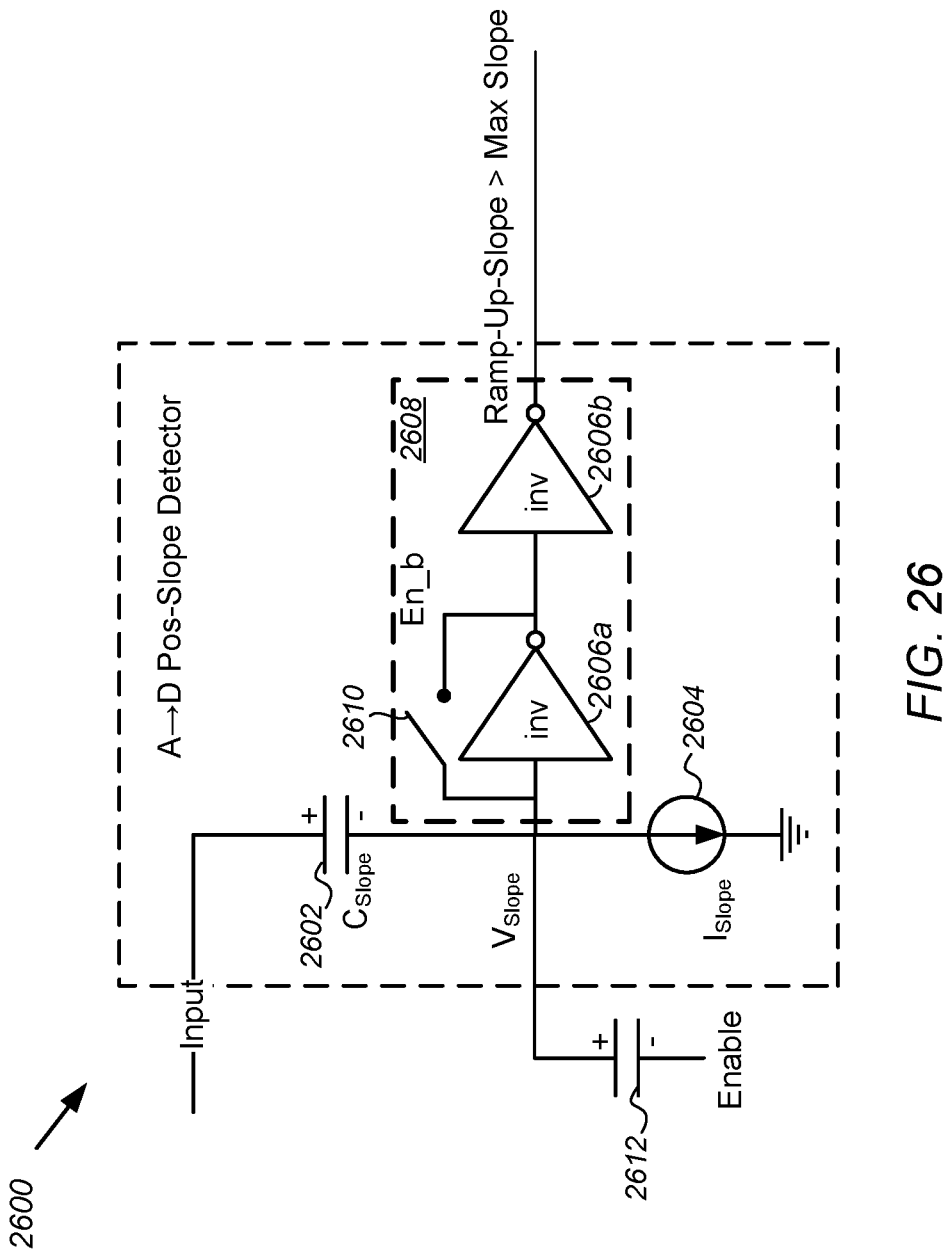
FIG. 26 is a schematic block diagram of an embodiment of a positive slope-detector with accelerated wakeup.

FIG. 26 is a schematic block diagram of an embodiment of a positive slope-detector 2600 with accelerated wakeup. The positive slope-detector 2600 analogous to the positive slope-detector 500 of FIG. 5 and functions in a similar manner. Referring to FIG. 26, the positive slope-detector 2600 includes a feedback or integration capacitor 2602 having a first terminal coupled through an input of the detector, a current source 2604 coupled between a second terminal of the capacitor and ground, and two serial inverters 2606a and 2606b that function as a comparator 2608. In addition the positive slope-detector 2600 further includes an equalization (EQ) switch 2610 coupled between an input and output of a first inverter 2606a in the comparator 2608, and an input boosting capacitor 2612 coupled to the first inverter between the integration capacitor 2602 and current source 2604 to enable an accelerated wakeup of the slope-detector, and substantially eliminate any wakeup offset. An enable signal (En) applied at wakeup causes the input boosting capacitor 2612 to share charge with the integration capacitor 2602 and initializes $V_{SLOPE}$ close to $V_{TRIP}$. As noted previously, on wakeup it is desirable that $V_{SLOPE}$ is at or slightly higher than $V_{TRIP}$ to prevent an unregulated Output$_{SLOPE}$, which can occur if $V_{SLOPE}$ is not crossing $V_{TRIP}$. Simultaneously or concurrently, an enable bar signal (En_b) is applied to momentarily close EQ switch 2610 causing the first inverter 2606a in the comparator 2608 to be reset to its trip-point, thereby enabling faster or near instantaneous operation of the slope-detector 2600. The enable signal (En) and the enable bar signal (En_b) can be supplied to the EQ switch 2610 and the input boosting capacitor 2612, either through manual selection by a user or automatically by an external system in which the slope-detector 2600 is used. Both the boost capacitor and EQ are used for the same purpose, thus only one of them is enough for fast wakeup.

As with the positive slope-detectors described previously the predetermined maximum slope (SLOPE$_{MAX}$) is proportional to $I_{SLOPE}/C_{SLOPE}$, and, because the integration capacitor 2602 and current source 2604 are integrally formed on a single IC chip, is constant over PVT conditions. The time for which the voltage transition is interrupted ($T_{SLOPE-WAIT}$) is an integration time needed for a magnitude of the slope indication voltage ($V_{SLOPE}$) to drop to less than a magnitude of the predetermined maximum slope (SLOPE$_{MAX}$) and is equal to:

$$T_{SLOPE-WAIT} = [C_{SLOPE} \times |V_{SLOPE} - V_{TRIP}|/I_{SLOPE}]$$

Figure 27:
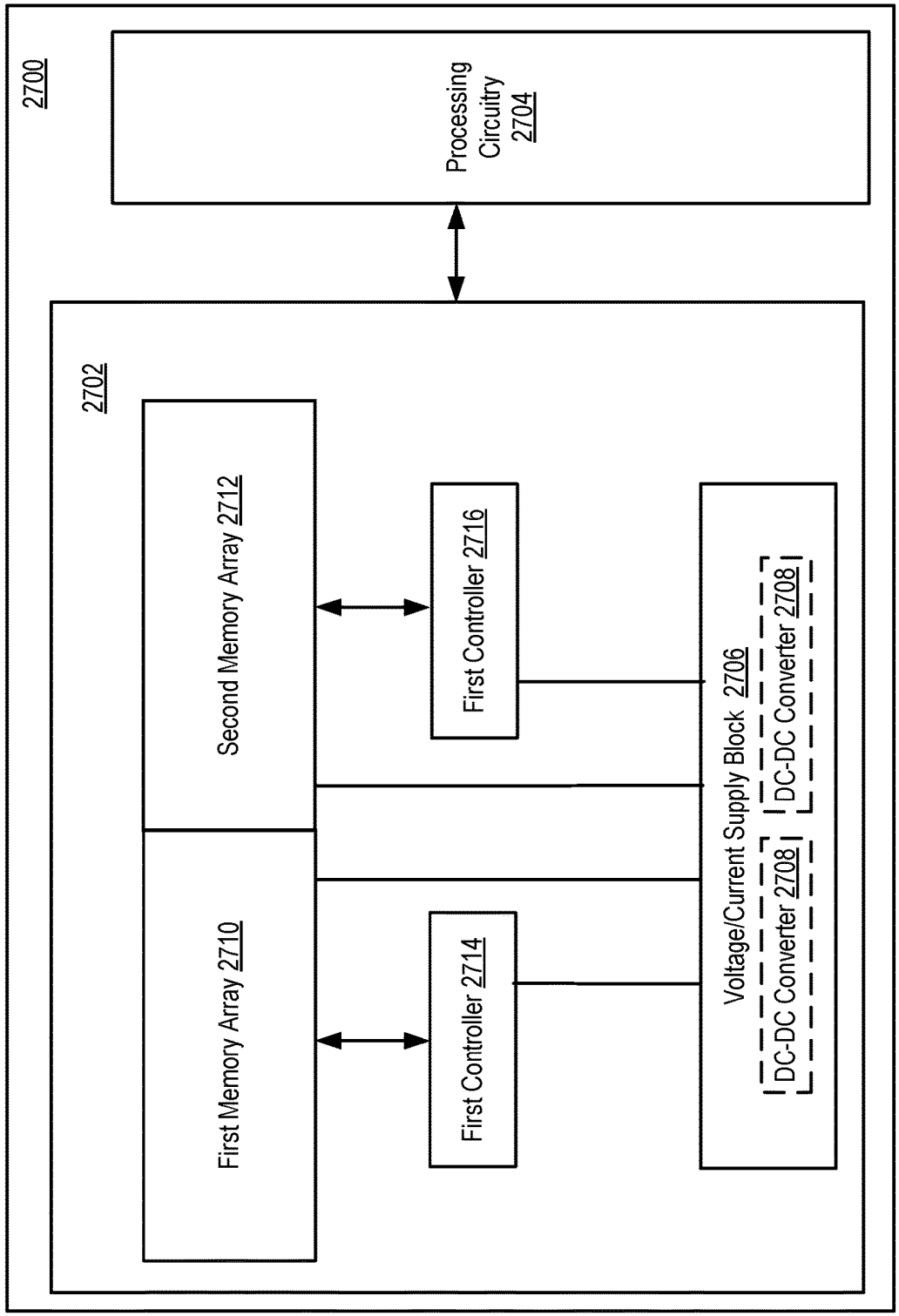
FIG. 27 is a block diagram of a system including embedded non-volatile memory (eNVM) and high voltage HV circuits for which an embodiment of a slope-controlled DC-DC converter is particularly useful.

FIG. 27 is a block diagram of a system 2700 including embedded non-volatile memory (eNVM 2702), such a flash memory, processing circuitry 2704, and a voltage/current supply block 2706 for which embodiments of one or more slope-controlled DC-DC converters 2708 as described herein are particularly useful. In some embodiments, the eNVM 2702 includes various memory arrays, such as a first memory array 2710 and a second memory array 2712, each including an array of non-volatile memory cells. In the embodiment shown, the first memory array 2710 and the second memory array 2712 may be implemented as different memory banks that each have their own respective controls provided by processing circuitry 2704. In some embodiments, eNVM 2702 further includes a first controller 2714 and a second controller 2716 which are each configured to provide support for read operations as well as program and erase operations for each of the first memory array 2710 and the second memory array 2712 respectively.

Generally, the voltage/current supply block 2706 is a multi-purpose mixed-signal block configured to provide eNVM 2702 with a range of voltages, currents, and digital signals/indicators that are utilized for the different modes of operation listed above. In various embodiments each of the slope-controlled DC-DC converters 2708 can include in addition to one or more positive and/or negative slope-detectors as described above, numerous different types of voltage sources (such as charge-pumps), current sources, as well as voltage regulators capable of supplying high resolution analog voltages in ranges suitable for use with the first and second memory arrays 2710, 2712, and their associated the first and second controllers 2714, 2716. For example, in one embodiment the slope-controlled DC-DC converters 2708 can include charge-pump and both a slope-detector and voltage-level-detector operating in parallel a to simultaneously regulate a voltage level and slope of an output voltage, as shown in FIGS. 12 and 16 and described above. Alternatively, in another embodiment the slope-controlled DC-DC converters 2708 can include a number of regulated voltage sources and a number of positive and/or negative slope-detector(s) controlling a multiplexer through which the number of regulated voltage sources are coupled to the output of the slope-controlled DC-DC converter, as shown and described above with respect to FIG. 18.

It will further be appreciated that components of nonvolatile memory eNVM 2702, including the slope-controlled DC-DC converters 2708, may be implemented on a same chip with the processing circuitry 2704 or on different chips.

Thus, DC-DC converters including slope regulation and a method of operating the same have been provided. It is noted that the slope controlled switches and DC-DC converters including such slope control provide more efficient control of voltage transitions than possible in switches and converters. This in turn enables designers to design circuits including one or more such switches or converters, all having faster transition times, substantially independent of variations in PVT. It will be further understood that this constancy transition enables design of circuits with faster and simpler control sequencing that avoid analog race condition.' Finally, the limited slope leads to uniform current consumption and prevention of peak currents in DC-DC converters including charge-pumps.

Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be understood that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. A system comprising:
   a number of voltage sources to supply one or more voltages to a capacitive load coupled to an output of the system;
   a switching-circuit coupled to the number of voltage sources to control a voltage on the output; and
   a slope-regulation-loop including a slope-detector coupled between the output and the switching-circuit to detect a slope of a voltage transition between a first voltage on the output and a second voltage,
   wherein the slope-detector is configured to generate a signal to the switching-circuit when a detected slope of the voltage transition exceeds a predetermined maximum slope to intermittently interrupt the voltage transition to limit the slope of the voltage transition to less than or equal to the predetermined maximum slope.

2. The system of claim 1 wherein the system is a direct current to direct current converter (DC-DC converter) and the number of voltage sources comprise a charge-pump, and wherein the switching-circuit comprises a logic gate coupled to the slope-detector, the logic gate to turn ON the charge-pump when the detected slope of the voltage transition is less than or equal to the predetermined maximum slope, and to turn the charge-pump OFF when the detected slope exceeds the predetermined maximum slope.

3. The system of claim 2 further comprising a voltage-level-regulation-loop in parallel with the slope-regulation-loop, the voltage-level-regulation-loop including a voltage-level-detector coupled between the logic gate and the output to detect the voltage on the output, and wherein the logic gate is further configured to turn OFF the charge-pump when the voltage on the output exceeds the second voltage.

4. The system of claim 2 wherein the charge-pump comprises a positive charge-pump, and wherein the slope-detector comprises a ramp-up slope-detector.

5. The system of claim 2 wherein the charge-pump comprises a negative charge-pump, and wherein the slope-detector comprises a ramp-down slope-detector.

6. The system of claim 1 wherein the system comprises a multiplexing direct current to direct current converter (DC-DC converter), and the switching-circuit comprises a multiplexer including one or more switches coupled between the number of voltage sources and the output, the one or more switches to turn ON and couple the number of voltage sources to the output when the detected slope of the voltage transition is less than or equal to the predetermined maximum slope, and to turn OFF when the detected slope exceeds the predetermined maximum slope.

7. The system of claim 6 wherein the slope-detector comprises a ramp-up slope-detector.

8. The system of claim 6 wherein the slope-detector comprises a ramp-down slope-detector.

9. The system of claim 6 wherein the slope-detector comprises a ramp-up and ramp-down slope-detector.

10. The system of claim 1 wherein the switching-circuit comprises one or more high voltage complementary metal-oxide-silicon (HV CMOS) switches.

11. The system of claim 1 wherein the slope-detector comprises an integration capacitor ($C_{SLOPE}$), a current source ($I_{SLOPE}$) and a comparator, and wherein the predetermined maximum slope is proportional to $I_{SLOPE}/C_{SLOPE}$.

12. The system of claim 11 wherein a time for which the voltage transition is interrupted ($T_{SLOPE-WAIT}$) is related to an integration time for a magnitude of a slope indication voltage ($V_{SLOPE}$) to drop to less than a magnitude of the predetermined maximum slope ($SLOPE_{MAX}$) and is equal to:

$$T_{SLOPE-WAIT} = [C_{SLOPE} \times |V_{SLOPE} - V_{TRIP}|/I_{SLOPE}]$$

where $V_{TRIP}$ is a trip-point voltage of the comparator.

13. A method of operating a direct current to direct current converter (DC-DC converter), the method comprising:
   providing a first voltage on an output of the DC-DC converter connected to a capacitive load;
   coupling a second voltage from one of a number of voltage sources to the output using a switching-circuit in the DC-DC converter;
   detecting on the output a slope of a voltage transition between the first voltage and the second voltage;
   generating and coupling a signal to the switching-circuit when a detected slope of the voltage transition exceeds a predetermined maximum slope; and
   intermittently interrupting the voltage transition using the switching-circuit to limit the slope of the voltage transition to less than or equal to the predetermined maximum slope.

14. The method of claim 13 wherein the number of voltage sources comprise a charge-pump coupled to the output, and the switching-circuit comprises a number of logic gates coupled to the charge-pump, and wherein intermittently interrupting the voltage transition comprises operating the number of logic gates to turn ON the charge-pump when the detected slope of the voltage transition is less than or equal to the predetermined maximum slope, and to turn the charge-pump OFF when the detected slope exceeds the predetermined maximum slope.

15. The method of claim 14 wherein the DC-DC converter further comprises a voltage-level-detector coupled to the number of logic gates, and further comprising detecting with voltage-level-detector a voltage on the output and operating the number of logic gates to turn OFF the charge-pump when the voltage on the output exceeds the second voltage.

16. The method of claim 13 wherein the switching-circuit comprises a multiplexer coupled between the number of voltage sources and the output, and wherein coupling the second voltage from the one of the number of voltage sources to the output comprises closing a switch in the multiplexer, and wherein intermittently interrupting the voltage transition comprises intermittently opening and closing the switch.

17. A system comprising:
   an embedded non-volatile memory (eNVM); and
   a direct current to direct current converter (DC-DC converter) to supply one or more voltages to enable different modes of operation of the eNVM, the DC-DC converter comprising:
      a number of voltage sources to supply one or more voltages to an output of the DC-DC converter;
      a switching-circuit coupled to the number of voltage sources to control a voltage on the output; and
      a slope-regulation-loop including a slope-detector coupled between the output and the switching-circuit to detect a slope of a voltage transition between a first voltage on the output and a second voltage, wherein the slope-detector is configured to generate a signal to the switching-circuit when a detected slope of the voltage transition exceeds a predetermined maximum slope to intermittently interrupt the voltage transition to limit the slope of the voltage transition to less than or equal to the predetermined maximum slope.

18. The system of claim 17 wherein the number of voltage sources comprise a charge-pump, and wherein the switching-circuit comprises a logic gate coupled to the slope-detector, the logic gate configured to turn ON the charge-pump when the detected slope of the voltage transition is less than or equal to the predetermined maximum slope, and to turn the charge-pump OFF when the detected slope exceeds the predetermined maximum slope.

19. The system of claim 18 wherein the DC-DC converter further comprises a voltage-level-regulation-loop in parallel with the slope-regulation-loop, the voltage-level-regulation-loop including a voltage-level-detector coupled between the logic gate and the output to detect the voltage on the output, and wherein the logic gate is further configured to turn OFF the charge-pump when the voltage output exceeds the second voltage.

20. The system of claim 17 wherein the switching-circuit comprises a multiplexer coupled between the number of voltage sources and the output, and wherein the multiplexer is configured to close a switch in the multiplexer to begin the voltage transition from the first voltage to the second voltage, and to receive the signal from the slope-detector and to intermittently open and close the switch to limit the slope of the voltage transition to less than or equal to the predetermined maximum slope.

* * * * *